United States Patent [19]
Manabe et al.

[11] Patent Number: 6,087,052
[45] Date of Patent: Jul. 11, 2000

[54] CHARGED PARTICLE BEAM EXPOSURE METHOD UTILIZING SUBFIELD PROXIMITY CORRECTIONS

[75] Inventors: Yasuo Manabe; Hiromi Hoshino, both of Kawasaki, Japan

[73] Assignee: Fujitsu Limited, Kawasaki, Japan

[21] Appl. No.: 09/055,990

[22] Filed: Apr. 7, 1998

[30] Foreign Application Priority Data

Oct. 1, 1997 [JP] Japan ................................. 9-269081
Oct. 1, 1997 [JP] Japan ................................. 9-269082

[51] Int. Cl.⁷ .................................................. G03F 9/00
[52] U.S. Cl. ............................................. 430/30; 430/296
[58] Field of Search ......................... 430/30, 296

[56] References Cited

U.S. PATENT DOCUMENTS 5,858,591  1/1999  Lin et al. ................................ 430/30

FOREIGN PATENT DOCUMENTS 8-321462  12/1996  Japan .

*Primary Examiner*—Christopher G. Young
*Attorney, Agent, or Firm*—Staas & Halsey LLP

[57] ABSTRACT

The basis of the present invention is a charged particle beam exposure method comprising the steps of: (a) generating a plurality of areas within the sub-fields; (b) determining the pattern density within each of the areas, and correcting the pattern density in accordance with the pattern density of areas surrounding the area and the distance between areas; (c) generating a supplementary exposure pattern in the area when the corrected pattern density for the area is lower than a prescribed reference exposure density; and (d) exposing the material in accordance with exposure data comprising the supplementary exposure pattern data appended to the pattern data. A first invention comprises a step for further generating a supplementary exposure pattern in areas lying between pattern existing regions where the patterns are located, and having a pattern density higher than the reference exposure density, when the distance between the pattern existing regions is greater than a prescribed reference distance.

16 Claims, 35 Drawing Sheets

ELECTRON BEAM EXPOSURE DEVICE

FIG. 1  ELECTRON BEAM EXPOSURE DEVICE

MAIN FIELD MF AND SUB-FILED SF

Smn (Pattern density)

FIG. 8

|  |  | 25% |  |  |
|---|---|---|---|---|
| 0% | 0% | a53 | 0% | 0% |
| a51 | a52 |  | a54 | a55 |
| 10% | 30% | 50% | 30% | 10% |
| a41 | a42 | a43 | a44 | a45 |
| 25% | 75% | 50% | 75% | 25% |
| a31 | a32 | a33 | a34 | a35 |
| 20% | 60% | 50% | 60% | 20% |
| a21 | a22 | a23 | a24 | a25 |
| 0% | 0% | 25% | 0% | 0% |
| a11 | a12 | a13 | a14 | a15 |

SF $$\Delta S_{33} = \sum_{m,n=1}^{5} S_{mn} \times \beta \left( r(a_{mn} - a_{33}) \right)$$

FIG. 9

| | | SF | | |
|---|---|---|---|---|
| 5%<br>a51 | 5%<br>a52 | 30%<br>a53 | 5%<br>a54 | 5%<br>a55 |
| 15%<br>a41 | P1<br>40%<br>a42 | 60% P2<br>a43 | P3 40%<br>a44 | 15%<br>a45 |
| 35%<br>a31 | 85%<br>a32 | 60%<br>a33 | 85%<br>a34 | 35%<br>a35 |
| 30%<br>a21 | 70%<br>a22 | 60%<br>a23 | 70%<br>a24 | 30%<br>a25 |
| 5%<br>a11 | 5%<br>a12 | 30%<br>a13 | 5%<br>a14 | 5%<br>a15 |

$$SRmn = Smn + \Delta Smn$$

FIG. 10

20 Correction table

| Stage | Pattern density SRmn (%) | Supplementary exposure pattern generation | Correction ratio α for correction |
|---|---|---|---|
| 1 | 0.0 ~ 9.5 | Supplementary exposure 1 | 1.0 |
| 2 | 9.5 ~ 18.5 | Supplementary exposure 2 | 1.0 |
| 3 | 18.5 ~ 27.5 | Supplementary exposure 3 | 1.0 |
| 4 | 27.5 ~ 36.5 | Supplementary exposure 4 | 1.0 |
| 5 | 36.5 ~ 45.5 | Supplementary exposure 5 | 1.0 |
| 6 | 45.5 ~ 54.5 | No supplementary exposure | 1.0 |
| 7 | 54.5 ~ 63.5 | No supplementary exposure | 0.8 |
| 8 | 63.5 ~ 72.5 | No supplementary exposure | 0.6 |
| 9 | 72.5 ~ 81.5 | No supplementary exposure | 0.4 |
| 10 | 81.5 ~ 90.5 | No supplementary exposure | 0.2 |
| 11 | 90.5 ~ 100.0 | No supplementary exposure | 0.1 |

EXAMPLE OF AREA DATA

RATIO TABLE WHICH TAKES THE SPREADING CHARACTERISTICS OF THE SUPPLEMENTARY EXPOSURE PATTERN INTO ACCOUNT

QUANTITY OF EXPOSURE DISTRIBUTION OF FIG. 20

Supplementary exposure patterns having area size are generated in ☐

EXAMPLE OF BLOCK MASK BM

EXAMPLE OF EXPOSURE DATA INCLUDING BLOCK MASK DATA

FIG. 33A
TABLE OF PROPOSED MINIMUM
LINE WIDTHS FOR BLOCK
MASK PATTERN DATA
| W1 | 0.18 μm |
|----|---------|
| W2 | 0.20 μm |
| W3 | 0.22 μm |
| W4 | 0.24 μm |
| W5 | 0.26 μm |
FIG. 33B
MINIMUM LINE WIDTH
FOR VARIABLE RECTANGULAR
PATTERN DATA
| Wmin | 0.18 μm |
|------|---------|
FIG. 34A
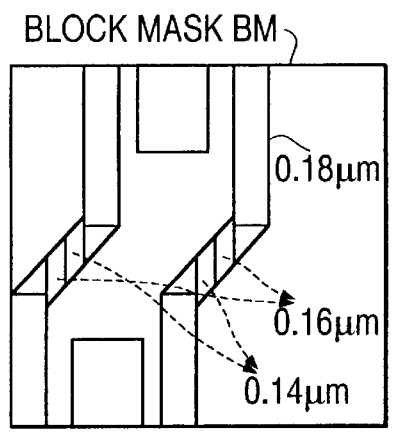
FIG. 34B
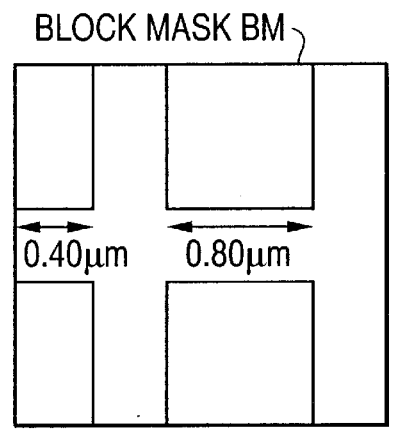

FLOW CHART FOR GENERATING QUANTITY OF EXPOSURE FOR BLOCK MASK

FIG. 37A
FIG. 37B
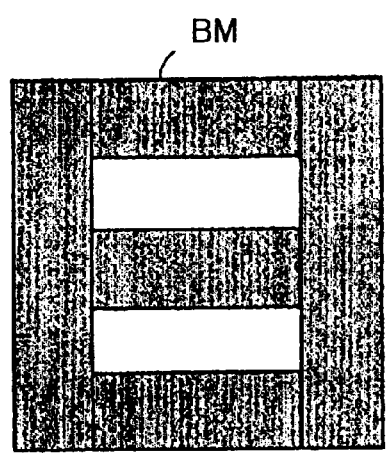
BM
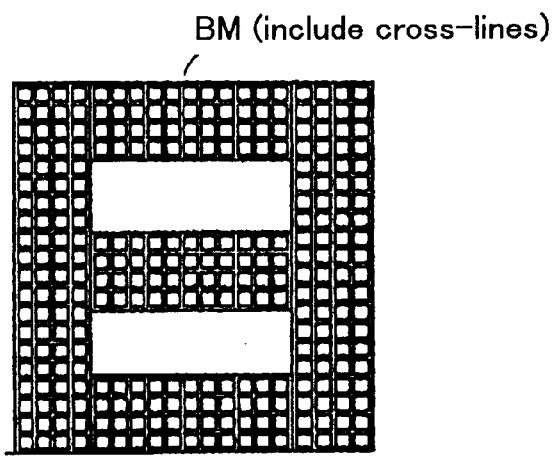
BM (include cross-lines)
Black portion is transmission hole

CHARGED PARTICLE BEAM EXPOSURE METHOD UTILIZING SUBFIELD PROXIMITY CORRECTIONS

BACKGROUND OF THE INVENTION

1. Field of the Invention

The present invention relates to a charged particle beam exposure method and a charged particle beam exposure device, and more particularly, to a method for creating exposure data for exposing patterns on a semiconductor wafer by means of a charged particle beam, such as an electron beam exposure, and a charged particle beam exposure device for implementing this method.

2. Description of the Related Art

The a charged particle beam exposure, such as an electron beam, is able to expose patterns of the sub-micron order and is used in the fabrication of highly integrated LSIs. In particular, recently, in addition to its use in forming masks, methods whereby the charged particle beam is irradiated directly onto the resist formed on a semiconductor wafer have been used.

In the design stage for LSIs, pattern data for a multi-layered structure is created in order to form a desired integrated circuit. The resist on a semiconductor wafer or the resist on a mask substrate is exposed according to this pattern data. The resist is subject to a chemical reaction generated by the energy of a charged particle beam which is irradiated onto the resist layer.

In this case, it is important to take note of the proximity exposure effect, which is caused by forward or backward scattering of the beam in the resist when the charged particle beam is irradiated onto the resist. The proximity exposure effect is a phenomenon which causes the energy of a charged particle beam irradiated onto a particular region to spread into adjacent regions due to scattering of the beam. For example, in a region where the exposure pattern density is high, after developing, a pattern may have broadened due to the effect of beam energy from a charged particle beam irradiated onto an adjacent exposure pattern region.

Alternatively, in a region where the exposure pattern density is low, there will be no effect due to energy from adjacent regions, and the pattern after developing may be condensed or narrow.

Therefore, the designed exposure data must be corrected, taking this proximity exposure effect into consideration. The present applicants have proposed such a method for correcting exposure data in Japanese Patent Application 8-13354 (Japanese Unexamined Patent 8-321462), dated $29^{th}$ January 1996.

Briefly stated, in the method proposed in this patent application, a plurality of mask areas are generated in a sub-field, the pattern density in each of these areas is corrected in accordance with the effects due to the pattern density in surrounding areas, an effective pattern density taking the proximity exposure effect into account is determined, the quantities of exposure (which means beam intensity exposure time, herein after quantity of exposure) for the patterns in each area are revised in accordance ith this effective pattern density, and supplementary exposure patterns are generated additionally.

However, since the supplementary exposure patterns are produced by generating areas of a particular size without relation to the position of patterns located in a sub-field, and by taking these areas as the pattern units, there are cases where it is not possible to generate a suitable supplementary exposure pattern corresponding to an actual exposure pattern. Moreover, if the pattern density in an area is corrected with regard to the effect of the pattern density in surrounding areas, in some cases, the distance between the areas may be different from the distance between the actual pattern groupings, and in this event, it is not possible to account for the proximity exposure effect accurately. Furthermore, if the aforementioned areas are generated, the pattern density is corrected, and a supplementary exposure pattern is produced, separately in a similar manner, for each of a plurality of sub-fields which have the same exposure pattern and are positioned by repetition of, then this lengthens the data processing step for no purpose, and is not suitable for creating exposure data for highly integrated LSIs.

Furthermore, when using charged particle beam exposure, the throughput in variable square beam exposure systems deteriorates as the number of patterns increases, and therefore exposure by means of a block mask which is broader than the variable rectangle and comprises a plurality of patterns is used for regions wherein the same pattern is formed repeatedly. Since a relatively broad region comprising a plurality of patterns can be exposed in a single beam irradiation cycle, throughput can be increased.

If a block mask is used, then a plurality of patterns are comprised within a block mask and there may be respective differences between the line widths in these patterns. However, in block mask exposure, all of the patterns contained therein must be exposed with the same quantity of beam. According to the method for generating exposure data described above, the quantity of exposure is set depending on the pattern shape. In particular, the quantity of exposure is reduced when the line width is thick, and it is increased when the developed line width is narrow. This is because, when the line width is thick, the actual quantity of exposure is increased due to the proximity exposure effect from surrounding regions, and the developed line width becomes thicker, whereas when the line width is narrow, the developed one becomes narrower. Accordingly, when a block mask is used, the minimum line width is detected, for example, and the quantity of exposure is set according to this line width.

In this case, if there is a pattern with a narrow line width in a portion of the block mask, there may be cases where the quantity of exposure is set to an excessively high value accordingly, and the pattern width after developing will become too thick.

A problem arising when using block masks is that since there is a high pattern density in the block mask, when beam exposure is conducted repeatedly using a block mask, there is a tendency for the developed patterns to become thicker, due to the effect of "Coulomb interaction". This effect is especially notable at the peripheral edges of regions which are exposed repeatedly using a block mask.

SUMMARY OF THE INVENTION

Therefore, it is an object of the present invention to resolve the aforementioned problems of the prior art by providing a charged particle beam exposure method and a charged particle beam exposure device for implementing same, whereby it is possible to create exposure data enabling patterns of greater accuracy to be formed.

It is a further object of the present invention to provide a charged particle beam exposure method and a charged particle beam exposure device for implementing same, whereby it is possible to create exposure data which resolves inadequacies due to divergence between areas which are generated uniformly within a sub-field and the actual exposure patterns.

It is a further object of the present invention to provide a charged particle beam exposure method and charged particle beam exposure device for implementing same, whereby it is possible to take account of the effects of the pattern densities in surrounding areas, with respect to the positions of the actual patterns.

It is a further object of the present invention to provide a charged particle beam exposure method, whereby a suitable quantity of exposure is set for charged particle beam exposure using a block mask.

It is a further object of the present invention to provide a charged particle beam exposure method, whereby the effects of Coulomb interaction are eliminated and pattern variations due to the proximity exposure effect are also eliminated, in charged particle beam exposure using a block mask.

In order to achieve the aforementioned objects, in a charged particle beam exposure method, wherein exposure data comprising exposure pattern data for each of a plurality of sub-fields located in a main field is determined from pattern data comprising pattern data for each of the sub-fields, and a material is exposed in accordance with the exposure data, the basis of the present invention is a charged particle beam exposure method comprising the steps of: (a) generating a plurality of areas within the sub-fields; (b) determining the pattern density within each of the areas, and correcting the pattern density in accordance with the pattern density of areas surrounding the area and the distance between areas; (c) generating a supplementary exposure pattern in the area when the corrected pattern density for the area is lower than a prescribed reference exposure density; and (d) exposing the material in accordance with exposure data comprising the supplementary exposure pattern data appended to the pattern data.

A first invention comprises a step for further generating a supplementary exposure pattern in areas lying between pattern existing regions where the patterns are located, and having a pattern density higher than the reference exposure density, when the distance between the pattern existing regions is greater than a prescribed reference distance.

According to the first invention, even if there is mismatching between an exposure pattern and an area generated in a sub-field, and no supplementary exposure pattern is produced when it is judged simply by the pattern density in the area, it is still possible to generate a supplementary exposure pattern when the distance between the pattern existing regions is greater than a set distance. Therefore, a suitable supplementary exposure pattern can be generated, providing an appropriate proximity exposure effect, even when there is mismatching between the exposure pattern and the area.

In a second invention, the supplementary exposure pattern has a desired exposure energy distribution according to the resist material formed on the material.

According to the second invention, even if the spreading characteristics of the exposure beam energy vary depending on the resist material, it is possible to generate a supplementary exposure pattern having an exposure energy distribution corresponding to these characteristics. Therefore, a suitable proximity exposure effect can be achieved in accordance with the resist material used.

In a third invention, the step (a) generates a plurality of areas in point symmetry from the center of pattern existing regions in the sub-field, within a peripheral region of a prescribed range.

According to the third invention, mismatching between exposure patterns and areas is prevented by generating the areas in point symmetry from the center of pattern existing regions, and therefore supplementary exposure patterns which are matched to the exposure patterns can be generated.

In a fourth invention, the step (b) determines the pattern density within each of the areas, and corrects the pattern density in accordance with the pattern density of areas surrounding the area, and the distance between pattern existing regions in the areas.

According to the fourth invention, since the effect of exposure energy from patterns in surrounding areas is determined by the distance between pattern existing regions, the effect of this exposure energy can be determined more accurately. Consequently, a more accurate supplementary exposure pattern can be generated. Desirably, the distance between pattern existing regions is taken as the distance between the centers of gravity of the pattern existing regions.

In a fifth invention, when a plurality of sub-fields comprising the same pattern data are positioned by repetition, the steps (a)–(c) are implemented for the first of the repeated sub-fields, and if no supplementary exposure pattern is generated in the first sub-field, the steps (a)–(c) are omitted for the remaining sub-fields, with the exception of at least a portion thereof.

According to the fifth invention, the speed of calculation for repeated sub-fields can be shortened.

In order to achieve the aforementioned objects, in a sixth invention, the quantity of exposure set for a block mask is not set as the quantity of exposure corresponding to the minimum line width of the block exposure pattern data, but rather, if there exists block exposure pattern data which is narrower than a previously determined proposed minimum line width, then it is set as the quantity of exposure corresponding to this proposed minimum line width for the blockmask. Therefore, even if there exists block exposure pattern data which is narrower than the design rules, it is possible to avoid setting an excessively high quantity of exposure.

In other words, in a charged particle beam exposure method, wherein a charged particle beam passing through a block mask containing a plurality of patterns is irradiated onto a material to be exposed, the present invention comprises the steps of: specifying a proposed minimum line width for pattern data in the block mask; setting a quantity of exposure corresponding to the proposed minimum line width as the quantity of exposure for the block mask, when the minimum line width of the pattern data in the block mask is narrower than the proposed minimum line width, and setting a quantity of exposure corresponding to the minimum line width of the pattern data as the quantity of exposure for the block mask, when the minimum line width of the pattern data in the block mask is thicker than the proposed minimum line width; and irradiating a charged particle beam having the set quantity of exposure onto the material to be exposed by passing it through the block mask.

In the aforementioned invention, in the step of specifying the proposed minimum line width, a plurality of the proposed minimum line widths are set in a prescribed order of priority, and a quantity of exposure corresponding to the proposed minimum line width which is close, of the set plurality of proposed minimum line widths, to the minimum line width of the pattern data in the block mask, is set as the quantity of exposure for the block mask.

Furthermore, in a charged particle beam exposure method wherein a charged particle beam is shaped in accordance with variable rectangular pattern data and is irradiated onto a material to be exposed, the present invention comprises the steps of: specifying a proposed minimum line width corresponding to the variable rectangular pattern data; setting a quantity of exposure corresponding to the proposed minimum line width as the quantity of exposure for the variable rectangular pattern, when the minimum line width of the variable rectangular pattern data is narrower than the proposed minimum line width, and setting a quantity of exposure corresponding to the minimum line width of the variable rectangular pattern as the quantity of exposure light for the variable rectangular pattern, when the minimum line width of the variable rectangular pattern data is thicker than the proposed minimum line width; and shaping a charged particle beam having the set quantity of exposure irradiating into the variable rectangular beam and shining the beam onto the material to be exposed.

By setting the aforementioned proposed minimum line widths, the quantity of exposure is prevented from becoming excessively high, in the case of variable rectangular pattern data, also.

Furthermore, in a charged particle beam exposure method wherein a charged particle beam passing through a block mask containing a plurality of patterns is irradiated repeatedly in a matrix fashion onto a material to be exposed, the present invention comprises the steps of: exposing block exposure patterns corresponding to regions located at the perimeter of the matrix in the matrix-shaped exposure region, by means of a variable rectangular beam; and exposing block exposure patterns corresponding to regions located at the center of the matrix in the matrix-shaped exposure region, by means of a charged particle beam passing through the block mask.

According to this invention, when conducting exposure by block mask repeatedly in a matrix fashion, by exposing regions at the perimeter of the matrix with the patterns contained in the block mask by means of respective variable rectangular beams, rather than using exposure by block mask, the effect of Coulomb interaction is prevented and it is possible to avoid thickening of line patterns in perimeter regions.

Moreover, in a charged particle beam exposure method wherein exposure data comprising exposure pattern data for each of a plurality of sub-fields existing in a main field is determined from pattern data comprising pattern data for each of the sub-fields, and a material is exposed in accordance with the exposure data, the present invention comprises the steps of: generating a plurality of areas within the sub-fields; determining the pattern density within each of the areas, and correcting the pattern density in accordance with the pattern density of areas surrounding the area, and the distance between areas; generating a supplementary exposure pattern in the area when the corrected pattern density for the area is lower than a prescribed reference exposure density; and exposing the material in accordance with exposure data comprising the supplementary exposure pattern data appended to the pattern data; wherein the reference exposure density is lower for areas having a block mask pattern containing transmission holes in a lattice configuration, than for other areas.

According to the aforementioned invention, it is possible to set the reference exposure ratio, which is the reference for generating supplementary exposure pattern data, to a low figure, when a block mask is used which contains cross-lines in the block exposure pattern in order to prevent Coulomb interaction effects, and hence the generation of unnecessary supplementary exposure pattern data can be prevented.

BRIEF DESCRIPTION OF THE DRAWINGS

FIG. 8 is a diagram for describing the process of correcting pattern density in accordance with proximity exposure effects between areas;

FIG. 9 is a diagram showing the pattern densities in each area after correction;

FIG. 10 is a diagram showing an example of a correction table used in the process of correcting the quantities of beam and the process of generating supplementary exposure patterns;

FIGS. 33A and 33B are diagrams showing an example of a table of minimum line width settings;

FIGS. 34A and 34B are diagrams showing examples of block masks;

FIGS. 37A and 37B are diagrams showing an example of a block mask having a large exposure surface area.

DESCRIPTION OF THE PREFERRED EMBODIMENT

Below, a performed embodiment of the present invention is described with reference to the drawings. However, this mode of implementation does not limit the technical scope of the present invention. Furthermore, whilst the present invention relates to a charged particle beam exposure method and a device for same, the mode of implementation described below takes as an example an electron beam exposure method and device for same.

Figure 1:
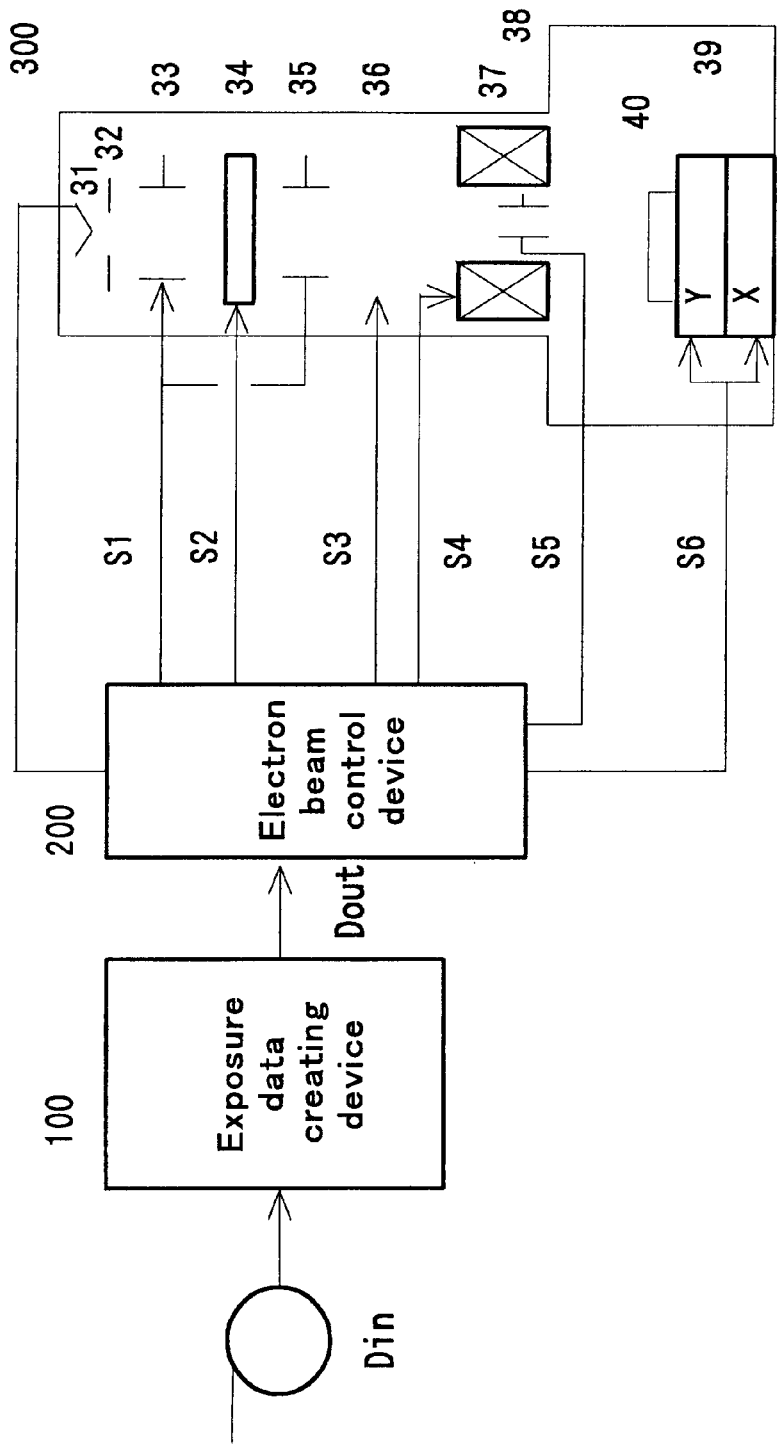
FIG. 1 is an approximate compositional view of an electron beam exposure device according to an embodiment of the present invention.

FIG. 1 is an approximate compositional view of an electron beam exposure device according to am embodiment of the present invention. In this example, an electron beam exposure device comprises: an exposure data creating device 100 which inputs design data Din containing pattern data, and outputs exposure data Dout taking the proximity exposure effect into account; an electron beam control device 200 which is supplied with this exposure data Dout and controls the exposure device; and a mirror barrel 300. The mirror barrel 300 contains: an electron gun 31; a rectangular transmission mask 32; a transmission mask for exposure 34, such as a block mask, or the like; mask deflectors 33, 35; a focal lens 36; an electromagnetic deflector 37; an electrostatic deflector 38; and an X, Y stage 39 whereon a wafer 40 is mounted. A rectangular beam formed by the transmission mask 32 is transmitted through a prescribed mask on the transmission mask 34 selected by mask deflectors 33, 35, and is directed by deflectors 37, 38 onto a prescribed position on the wafer 40.

The electron beam control device 200 produces: control signal S1 for the mask deflectors 33, 35; control signal S2 which causes the transmission mask 34 to move horizontally; control signal S3 for the focal lens 36; control signal S4 for the electromagnetic deflector 37; control signal S5 for the electrostatic deflector 38; and control signal S6 for the stage.

Figure 2:
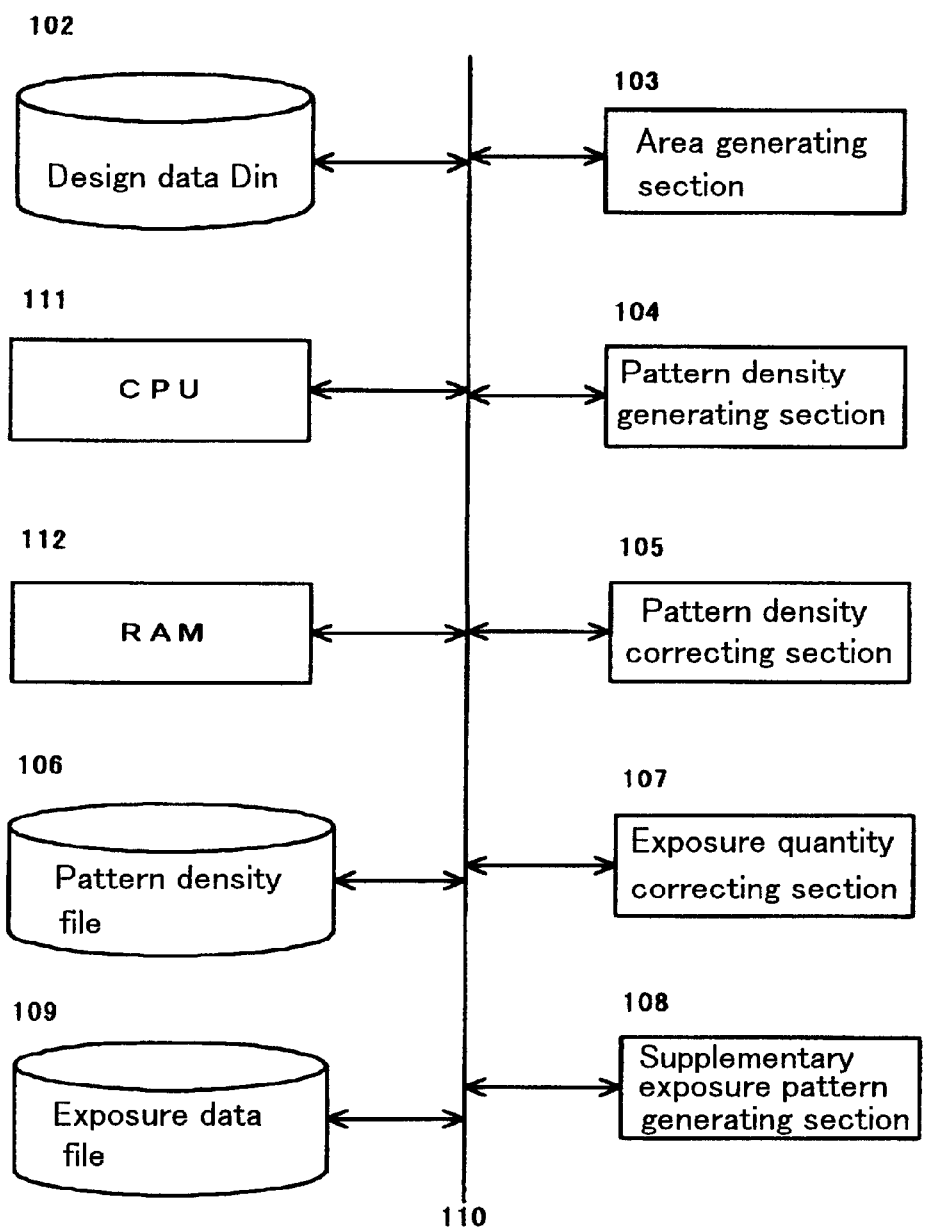
FIG. 2 shows the internal composition of an exposure data creating device 100.

FIG. 2 is a diagram showing the internal composition of the aforementioned exposure data creating device 100. It comprises: a design data file 102 for storing design data Din; an area generating section 103 for generating areas in sub-field regions; a pattern density generating section 104 for calculating the pattern density in an area; a pattern density correcting section 105 for correcting the pattern density in an area by taking the effects between areas into account; a pattern density file 106 for storing pattern density data in an area; an exposure quantity correcting section 107 for correcting the quantity of exposure for a pattern in an area in accordance with the pattern density; a supplementary exposure pattern generating section 108 for generating a supplementary exposure pattern in an area in accordance with the pattern density; and an exposure data file 109 for storing exposure data. These are all connected to a calculating section 11 by means of a bus 110.

[Summary of method for generating exposure data]

Figure 3:
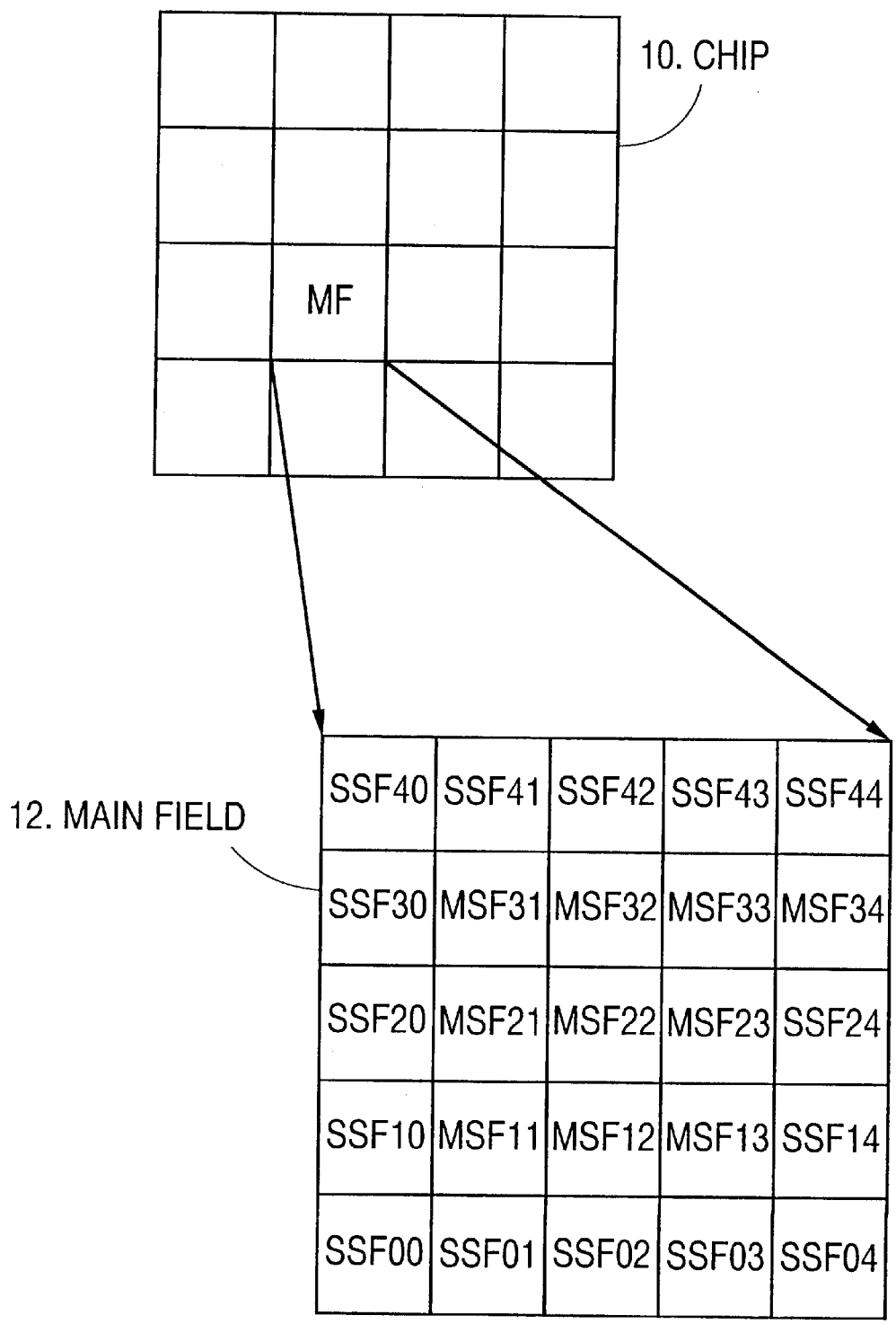
FIG. 3 is a diagram showing the relationship between a main field MF and sub-fields SF.

Below, a method for generating exposure data from design data is described in outline. FIG. 3 is a diagram illustrating the relationship between a main field MF and sub-fields SF in a semiconductor chip 10. Usually, a plurality of semiconductor chips 10 are formed on a semiconductor wafer. FIG. 3 shows the relationship between a main field and sub-fields in such a semiconductor chip 10. In the exposure device shown in FIG. 1, the electron beam deflectors comprise an electromagnetic deflector 37, which has a slow response speed but a large range of deflection, and an electrostatic deflector 38, which has a rapid response speed but a narrow range of deflection. The main field MF is a region to which the beam can be deflected by means of the electromagnetic deflector 37, and the sub-fields are regions to which the beam can be deflected by means of the electrostatic deflector 38.

The wafer is moved to the middle of a desired main field MF by driving the X, Y stage 39 of the exposure device, the electron beam is deflected within this main field MF by means of the electromagnetic deflector 37, and the electron beam formed to a desired shape is further deflected by means of the electrostatic deflector 38 such that it is irradiated onto a desired position. In the example in FIG. 3, a single main field 12 is divided into sub-fields SF00–SF44 in a five-row, five column configuration.

In the example shown in FIG. 3, the main field 12 contains independently positioned sub-fields SSF having different patterns respectively, and matrix-positioned sub-fields MSF which have the same pattern and are positioned by repetition. The repeated matrix-positioned sub-fields MSF closely resembles memory cell regions, for example, in a memory device. On the other hand, the independently positioned sub-fields closely resemble peripheral circuits, logic circuits, or the like. In this way, the chip 10 can be divided into a plurality of main fields, and a plurality of sub-fields within each of these main fields, and the design data Din contains the pattern data present in each respective sub-field.

Incidentally, the sub-fields do not necessarily have to be configured strictly without any overlapping or gaps, as depicted in FIG. 3, but rather, they may overlap partially, or gaps may be provided therebetween.

Figure 4:
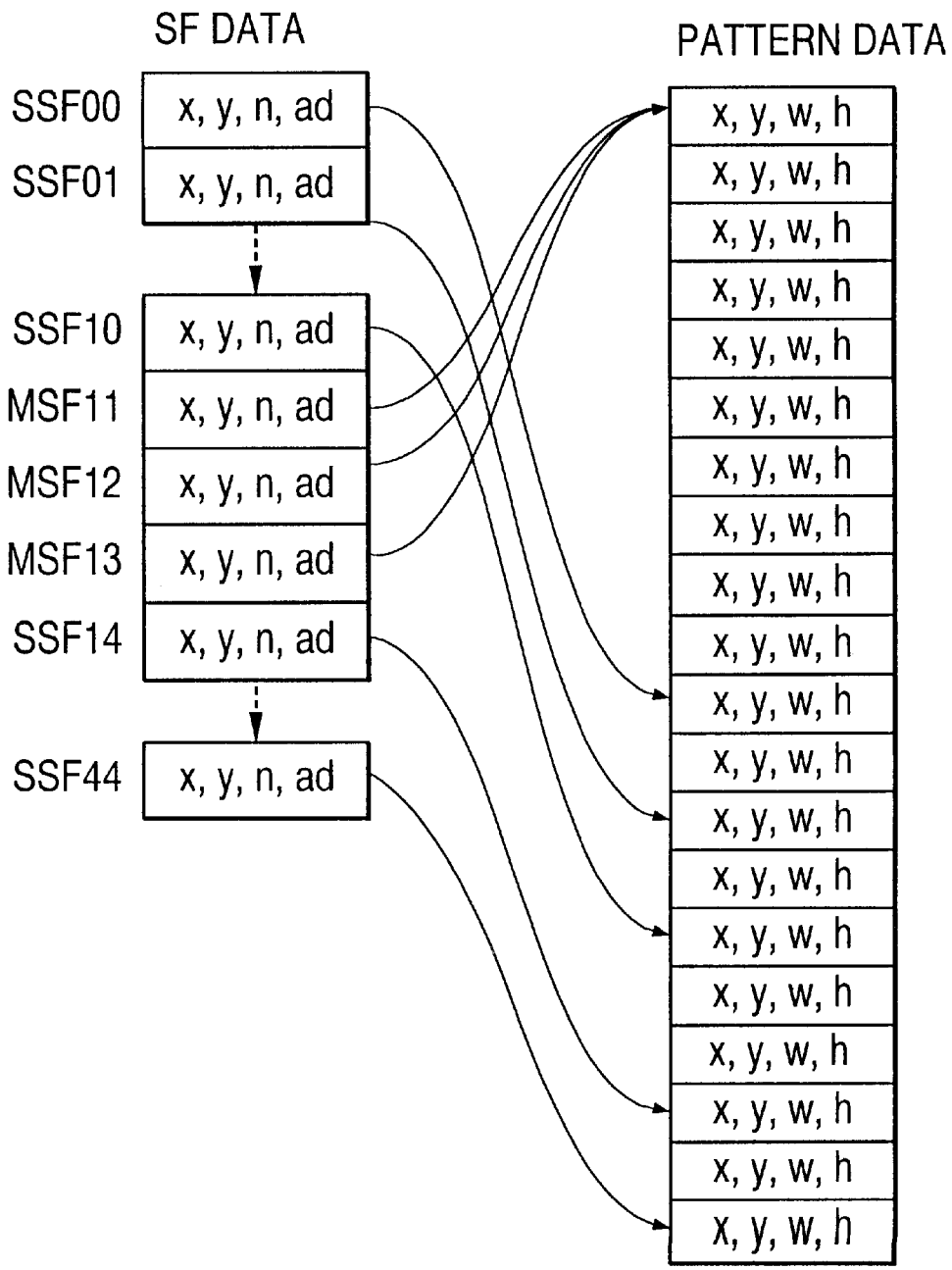
FIG. 4 is a diagram showing an example of the composition of design data relating to a sub-field in the main field in FIG. 3.

FIG. 4 is a diagram showing an example of the composition of design data relating to the sub-fields in the main field 12 shown in FIG. 3. In this example, the data for sub-fields SF00–SF44 comprises the central co-ordinates (x,y) of the sub-field, a pattern number n, and a pattern address ad, respectively. Here, the sub-field data SF Data is arranged in the order of the sub-fields in the main field 12: SSF00, SSF01, . . . MSF11, MSF12, . . . , SSF 44.

The pattern data, meanwhile, comprises the bottom left co-ordinates of the pattern (x,y), and the width w and height h of the pattern, for example. The address ad within the sub-field data region indicates an initial address in the pattern data, and the patterns in the n address regions counting consecutively from this address ad, is the pattern data for that respective sub-field.

Therefore, the data for independently positioned sub-fields SSF comprises mutually different pattern data addresses, whilst the data for matrix-positioned sub-fields MSF comprises pattern data addresses which are the same as each other. The data structure in a matrix-positioned sub-field is called a hierarchical data structure in the present specification. Using the hierarchical data structure of this kind allows the volume of pattern data to be reduced.

Figure 5:
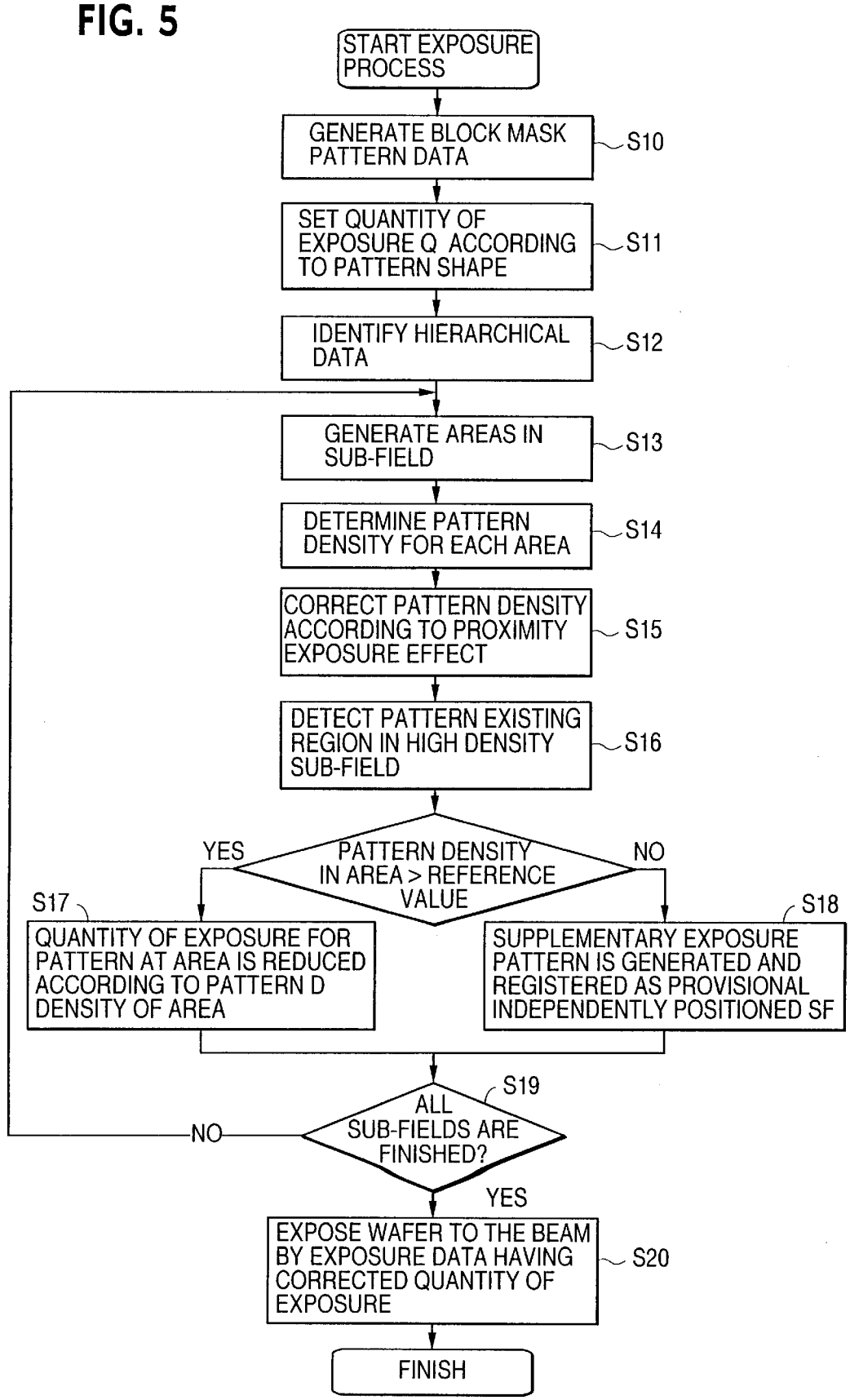
FIG. 5 is a flow-chart of exposure steps including the creation of exposure data.
Figure 6:
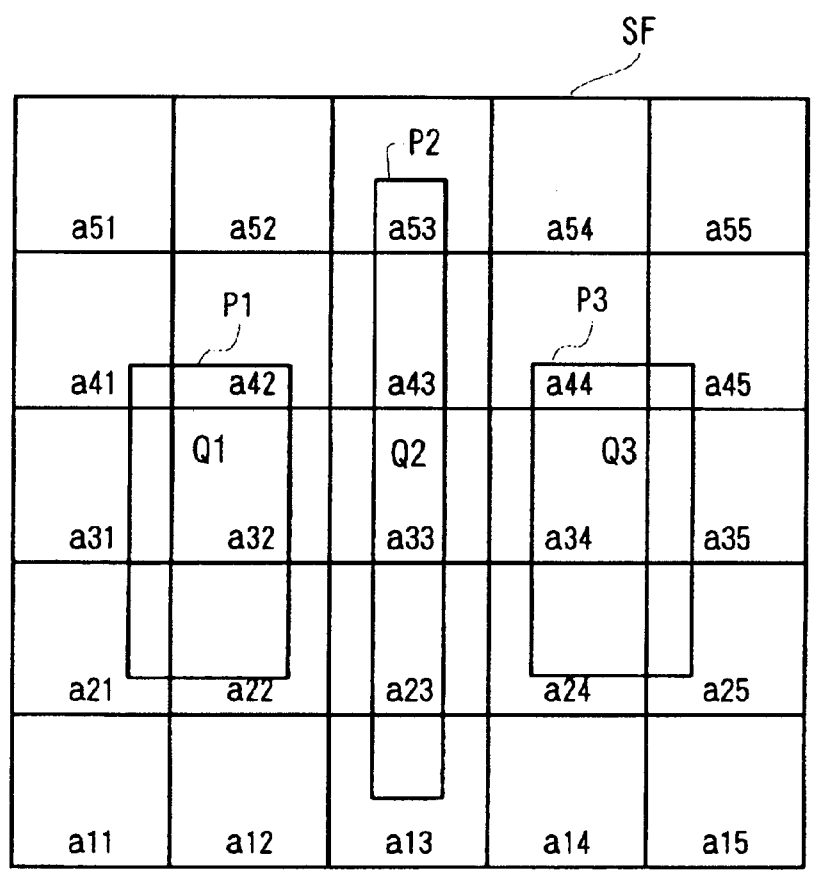
FIG. 6 is a diagram showing one example of a particular sub-field SF.

FIG. 5 is a flow-chart of exposure steps including the creation of exposure data. FIG. 6 is a diagram showing one example of a sub-field SF. A method for creating exposure data is now described using the sub-field in FIG. 6 as an example.

Firstly, block mask pattern data is generated (S10). This step is described later. In step S11 in FIG. 5, a quantity of exposure Q (beam intensity X exposure time) corresponding to the shape of each pattern is set. This quantity of exposure Q is set, for example, such that the quantity is large when the pattern shape is narrow, and it is relatively small when the pattern shape is thick or large. Thereupon, the set quantity of exposure Q (omitted from diagram) is appended to the pattern data. There are various methods for setting this quantity of exposure Q which are chosen according to the pattern shape, but since this does not form an essential part of the present mode of implementation, it is omitted here.

Next, hierachical data is identified from the design data comprising all the sub-fields on the chip and the pattern data for these sub-fields (S12). For example, it is confirmed from the design data whether the sub-field has an independently positioned sub-field SSF attribute or a matrix-positioned sub-field MSF attribute, and whether it has the first matrix-positioned sub-field attribute within the matrix-positioned sub-fields, and the like. The aforementioned attribute data at (omitted from drawing) is appended to the sub-field data accordingly.

The design data only contains patterns that is required to be formed on the resist layer on the wafer. However, if an electron beam is irradiated onto the resist layer on the wafer, regions of high pattern density will receive a large amount of beam energy due to proximity exposure effects. On the other hand, regions of low pattern density are not subject to the proximity exposure effect and are exposed to a lower beam energy. Therefore, the quantity of exposure corresponding to the design data pattern must be revised, taking the proximity exposure effect into account, and where necessary, supplementary exposure must be conducted to generate a proximity exposure effect intentionally in order to increase the accuracy of the pattern shape after developing. In the present mode of implementation, map areas smaller than the sub-fields are generated therein for the purpose of creating exposure data on the basis of the design data, and the aforementioned quantity of exposure is revised and the supplementary exposure pattern is generated on the basis of the pattern density in this area if necessary.

The sub-field SF shown in FIG. 6 comprises patterns P1, P2 and P3. Quantities of exposure Q1, Q2 and Q3 corresponding to the shapes of these respective patterns P1, P2, P3 are set in step S11 described above. Furthermore, areas a11—a55 in a five-row, five-column configuration are generated in the sub-field SF (step S13). These areas are generated by the area generating section 103 shown in FIG. 2. The method of generating these areas involves positioning regions of a prescribed size in a matrix fashion, with reference to the bottom-left position of the sub-field SF, for example. Therefore, the edges of the sub-field do not necessarily coincide with the edges of an area.

In the example shown in FIG. 6, pattern P1 covers areas a21, a22, a31, a32, a41, and a42. Pattern P2 covers areas a13, a23, a33, a43 and a53, and pattern P3 covers areas a24, a25, a34, a44 and a45.

Figure 7:
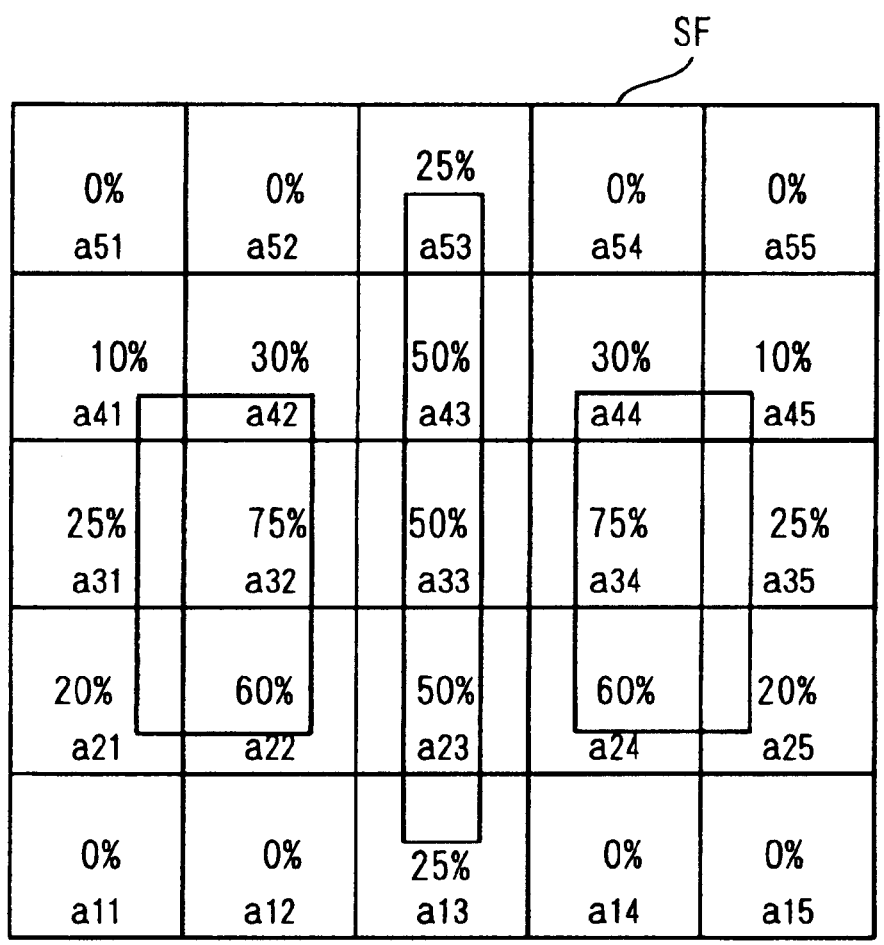
FIG. 7 shows the example in FIG. 6 with the pattern density Smn of each area of the sub-field entered thereon.

Thereupon, at step S14, the pattern density in each area is determined. Specifically, the pattern density is found by the pattern density generating section 104 shown in FIG. 2. FIG. 7 shows an example where figures for pattern density Smn have been input for each area of the sub-field shown in FIG. 6. In other words, the ratio of the pattern surface area to the area surface area in areas a32, a34, etc. is a high value of 75%, whilst the pattern density in area a11, or the like, where there is no pattern, is 0%.

Next, at step S15, the pattern density in each area is corrected according to the proximity exposure effect between areas. In the proximity exposure effect, the energy from the electron beam irradiated to form the patterns in areas surrounding a certain area creates an effect to the certain area in accordance with the distance between the areas. Thus, the effect is stronger from areas in close positions, whilst it is weaker in areas positioned further away. Therefore, in the present mode of implementation, a coefficient $\beta(r)$(where r is the distance between areas) which is in approximately inverse proportion to the distance is previously determined, the pattern density Smn of a surrounding area is multiplied by this coefficient $\beta(r)$, and the pattern densities of the areas in question are added up.

FIG. 8 is a diagram for describing the process of correcting pattern density in accordance with the proximity exposure effect between areas. In this example, the pattern density of area a33 is influenced by the proximity exposure effect from areas a11—a55 surrounding area a33. Since area a11, for example, has a pattern density of 0% (=S11), the effect is $S11 \times \beta(r(a11-a33))=0$. $r(a11-a33)$ indicates the intermediate distance between area a11 and a33. The figure for area a12 is also zero. Since area a13 has a pattern density of 25% (=S13), its effect is equal to $S13 \times \beta(r(a13-a33))$. The same process is carried out for areas a14–a55. As a result, the pattern density in area a33 is corrected from 50% to 60%, for example.

There are areas of high pattern density in the positions adjacent to area a33. Therefore, the energy of the electron beams irradiated onto these surrounding areas has a great effect on area a33. To account for the proximity exposure effect, the actual pattern density SR33 for area a33 is obtained by adding the density change $\Delta S33$ (shown in FIG. 8) due to the effect of surrounding areas to the pattern density S33 of area a33 itself.

FIG. 9 shows the pattern density in each area after the pattern densities have been corrected. In areas which are surrounded by areas of high pattern density, the pattern density is raised by some 10%, for example, and in areas which are not surrounded by such areas, the pattern density is raised by some 5%, for example. Furthermore, in areas positioned at the perimeter of the sub-field SF, such as area a11, the effect from areas in adjacent sub-fields is taken into account in a similar manner to the foregoing.

Step S16 involves the process of detecting the pattern existing region within a sub-field of high density. This step is explained in the section relating to the supplementary exposure pattern generating step, which is described later.

As shown in FIG. 9, when the pattern density of each area is corrected, the quantity of exposure for each pattern P1, P2, P3 is corrected (S17) and supplementary exposure patterns are generated (S18) if necessary, on the basis of these corrected pattern densities SRmn.

Whereas at step S11 quantities of exposure Q are set corresponding to the respective shapes of patterns P1, P2 and P3, when these quantities of exposure are corrected in step S17, they are corrected with regard to the proximity exposure effect from surrounding patterns. Therefore, the effective pattern densities for each area corrected at step S15 are used. In other words, when the effective pattern density SRmn is higher than a reference value, the proximity exposure effect is large, and therefore the quantity of exposure for a pattern belonging to that area is reduced.

On the other hand, if the effective pattern density SRmn for each area corrected at step S15 is lower than the reference value, the proximity exposure effect is small, and therefore a supplementary exposure pattern is generated and appended to the exposure data for that area in order to carry out supplementary exposure. Here, a supplementary exposure pattern is an exposure pattern for providing energy corresponding to the proximity exposure effect in regions of low pattern density, and the quantity of exposure in this supplementary exposure pattern has a uniform low value of several % or so of the exposure energy, for example. Desirably, the size of this supplementary exposure pattern is approximately the size of the area. However, the position of the supplementary exposure pattern is not necessarily the same as the area generated by pattern density revision.

FIG. 10 shows an example of a correction table used in the step of correcting the quantity of exposure (S17) and the step of generating a supplementary exposure pattern (S18). In this example, the pattern density SRmn of an area is divided into 11 stages, and the quantity of exposure correction ratio α and the supplementary exposure pattern for each stage are indicated. Here, the reference value is set to 45.5%, and if the pattern density for an area is greater than this reference value, the ratio α in the table in FIG. 10 is multiplied by the quantity of exposure Q for the pattern for this area. Specifically, the set quantity of exposure for a pattern in an area where the pattern density SRmn exceeds 90.5% is multiplied by a ratio α=0.1. Similarly, if the pattern density SRmn in the area is 81.5–90.5%, then the set quantity of exposure is multiplied by the ratio α=0.2.

On the other hand, if the pattern density in the area is less than the reference value, this indicates that the density in the vicinity of that area is low, and the developed pattern after exposure will be narrow. Therefore, a supplementary exposure pattern is generated in the form of exposure data in order to conduct a supplementary exposure for that area. In the example shown in FIG. 10, supplementary exposure patterns for conducting supplementary exposures 1–5 are generated for stages 1–5 where the pattern density is low. Supplementary exposure 1 is a supplementary exposure containing the highest quantity of exposure, whilst supplementary exposure 5 contains the lowest quantity of exposure. The supplementary exposure patterns are of similar size to the areas.

Figure 11:
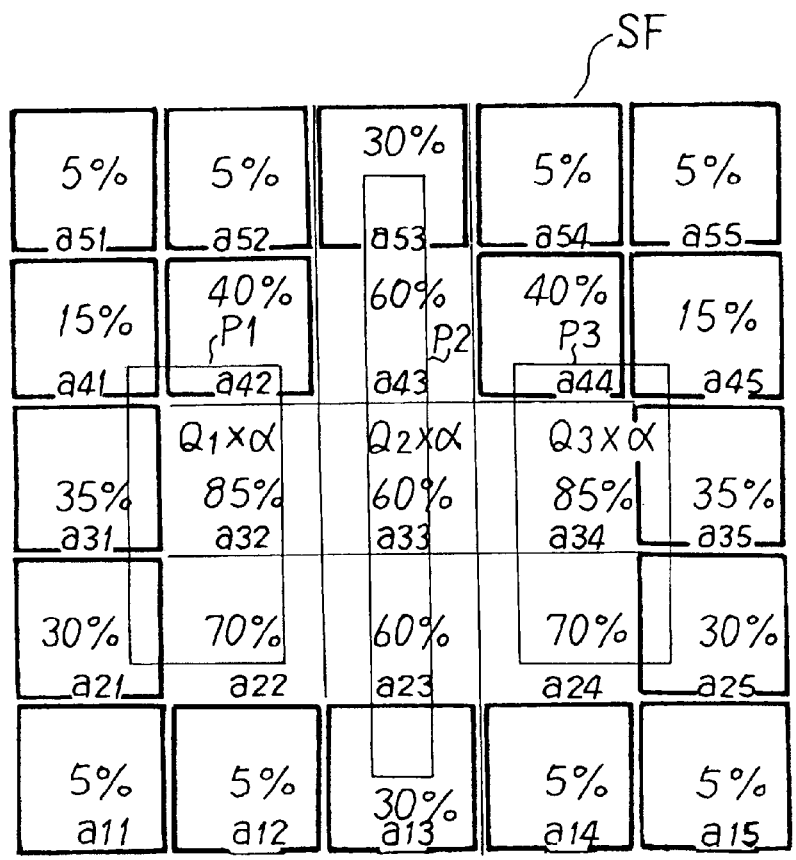
FIG. 11 is a diagram showing a sub-field in a case where the quantity of exposure for patterns in areas of high pattern density is reduced and supplementary exposure patterns are generated in areas of low pattern density.

FIG. 11 shows a sub-field in a case where the quantity of exposure for a pattern in areas of high pattern density is reduced and supplementary exposure patterns are generated for areas of low pattern density. In this example, the quantities of exposure Q for patterns P1, P2, P3 belonging to areas a22, a32, a23, a33, a43, a24, a34 of high pattern density are reduced by multiplying them by the ratio α. Furthermore, supplementary exposure patterns (indicated by thick lines) are generated for areas a11–a21, a25, a31, a35–a42, a44–a55, where the pattern density is low.

In the example in FIG. 11, the areas generated for the purpose of determining pattern density are used, as it is, as the regions for the supplementary exposure patterns. However, different areas to those used for generating the pattern densities may also be used as the regions for the supplementary exposure patterns.

As shown in FIG. 5, for each sub-field in the similar manner, areas are generated, pattern densities for areas are determined, these pattern densities are corrected to account for the effect of surrounding areas, and the quantities of exposure Q for the patterns are corrected and supplementary exposure patterns are generated if necessary, using these pattern densities as a reference. As a result, exposure data is created.

Figure 12:
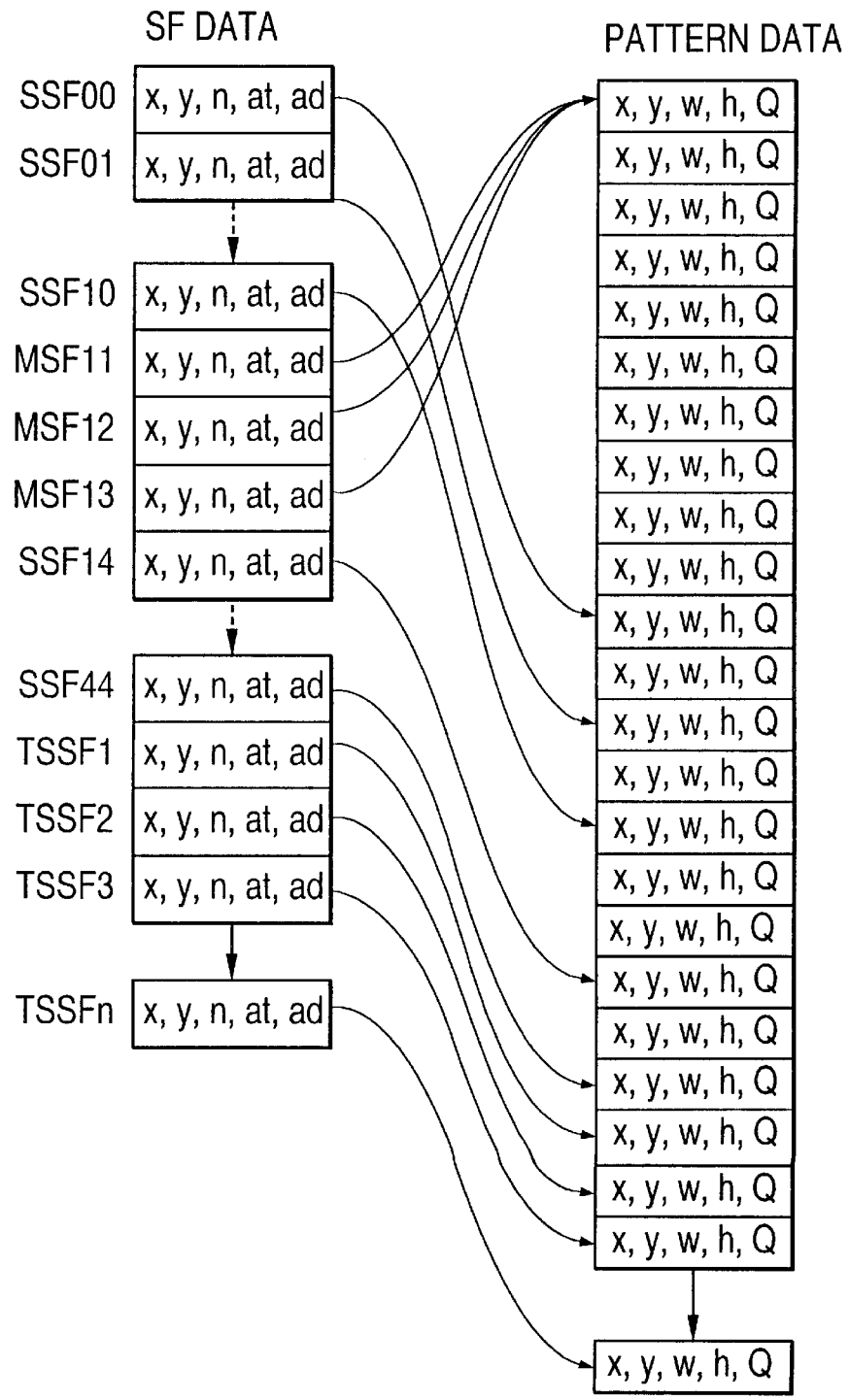
FIG. 12 is a diagram showing an example of the composition of generated exposure data.

FIG. 12 shows an example of the composition of the created exposure data. Firstly, whereas the pattern data in the design data in FIG. 4 comprises positional data (x,y), width w and height h, the pattern data in the exposure data also comprises the quantity of exposure Q. This quantity of exposure Q is set according to the shape of the initial pattern (S11), and is then corrected by using the pattern density for the area. Secondly, the sub-field data in the design data in FIG. 4 does not contain attribute data, such as independently-positioned sub-field, matrix-positioned sub-field, original sub-field, or the like, but the sub-field data in the exposure data in FIG. 12 contains attribute data at, which is appended at the hierarchical data identification step (S12). Thirdly, the design data comprises sub-fields SSF00–SSF44 and the pattern data relating to these sub-fields. However, the exposure data comprises additionally sub-fields TSSF1–TSSFn for supplementary exposure which contain supplementary exposure patterns.

In order to maintain the hierarchical structure between the sub-field data and pattern data, the supplementary exposure patterns are recorded in the exposure data in the form of exposure patterns in provisional independently positioned sub-fields, TSSF1–TSSSFn, which are a newly appended type of independently positioned sub-field. In FIG. 12, the provisional independently positioned sub-fields TSSF1–TSSFn are appended after the independently positioned sub-field SSF44. These provisional independently positioned sub-fields have supplementary exposure patterns of the same size as the areas. Since the supplementary exposure patterns within each provisional independently positioned sub-field are not repeated, the characteristics of a provisional independently positioned sub-field is the same as an independently positioned sub-field. A plurality of supplementary exposure patterns are generated in each provisional independently positioned sub-field.

The sub-fields do not necessarily have to be aligned in a single plane within a main field as shown in FIG. 3, but rather may also comprise partially overlapping regions, depending on the exposure pattern within the sub-fields. The exposure step simply involves irradiating an electron beam onto the exposure pattern contained in each sub-field at the respective position of the sub-field. Therefore, it is allowed for a supplementary exposure pattern sub-field to be recorded which overlaps with an exposure pattern sub-field. Thereby, the supplementary exposure pattern can be appended to the exposure data without in fringing the irradiated data structure.

As described previously, the quantities of exposure for the patterns in the provisional independently positioned sub-fields appended to the sub-fields in the design data are of an intensity which is not sufficient alone to expose the resist properly.

The exposure data Dout created in this way is then supplied to the electron beam control device 200, and electron beam exposure is carried out in accordance with this exposure data (S20).

One of the features of this method of creating exposure data is that areas are generated within the sub-fields in order to create exposure data that takes into account the proximity exposure effect, which is dependent on the exposure density and distance. The quantity of exposure is corrected and a supplementary exposure pattern is generated for a particular area on the basis of the effective pattern density SRmn, which is derived by adding the proximity exposure effect from surrounding areas to the pattern density Smn for that area. The supplementary exposure pattern is not treated as a pattern data in the existing sub-fields, but rather treated as a pattern data in newly generated provisional independently-positioned sub-fields.

However, in the aforementioned method, since the areas are generated in the sub-fields without regard to the shape or position of the pattern contained therein, a variety of problems may arise accordingly. Furthermore, since the shape of the supplementary exposure patterns are set to the shape of areas created without regard to the shape or position of the actual patterns, in some cases, they may differ from the ideal supplementary exposure patterns for resolving problems due to the proximity exposure effect. Below, these problems are described in more detail, along with means for resolving them.

[Generating supplementary exposure patterns between pattern existing regions]

Figure 13:
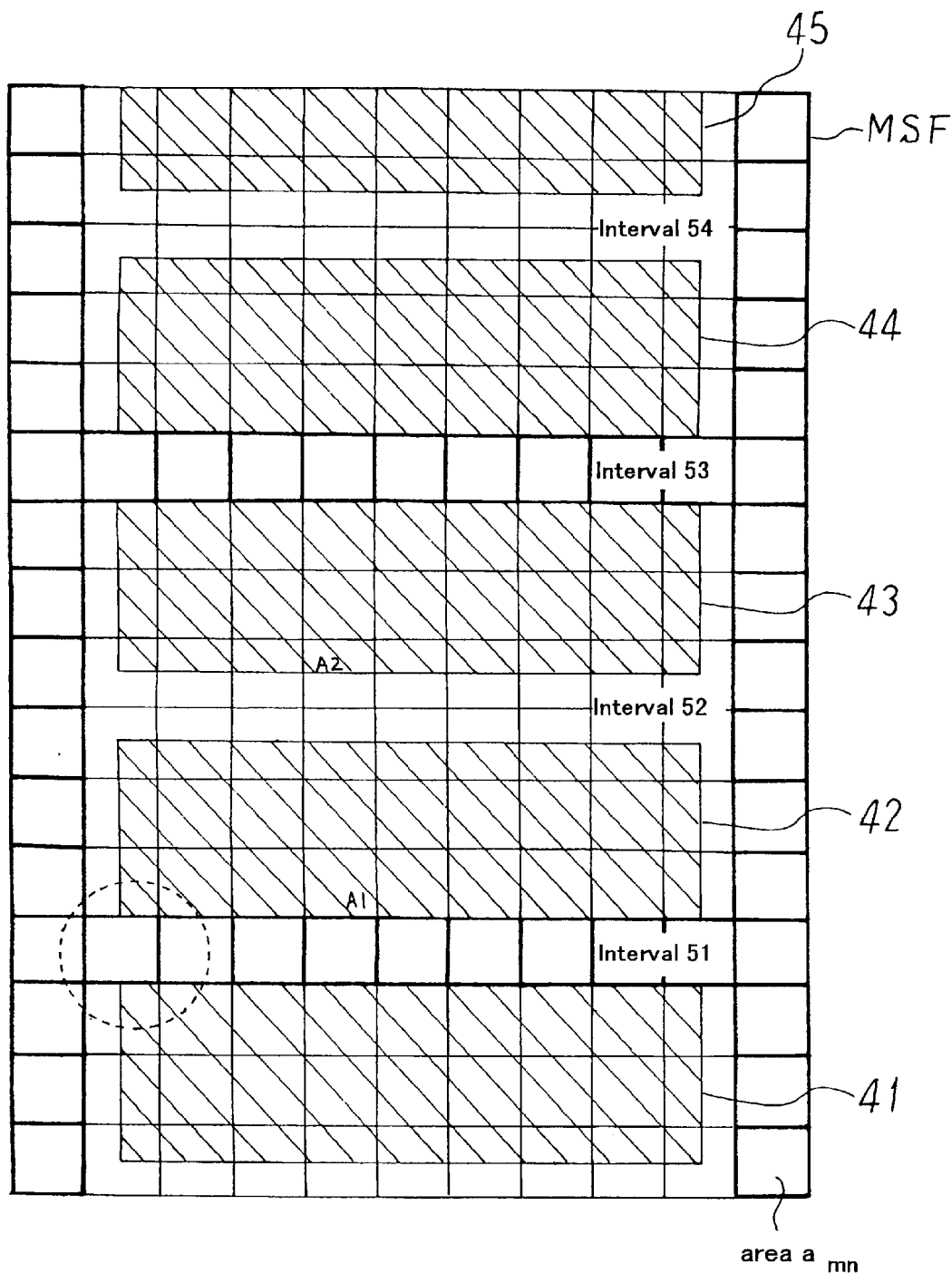
FIG. 13 is a diagram showing an example of supplementary exposure patterns generated in areas in a matrix-positioned sub-field MSF.

FIG. 13 shows an example of supplementary exposure patterns generated in areas of a matrix-positioned sub-field MSF. Typically, matrix-positioned sub-fields MSF are sub-fields where the same pattern is exposed repeatedly at high density, as in memory cell regions, for instance. In this sub-field, the regions 41–45 where patterns are existing are positioned a prescribed distance apart. In other words, there are pattern intervals 51–54 between the pattern existing regions 41–45. Without aligning the areas amn generated in the sub-field with the pattern existing regions 41–45, intervals 51 and 53 match with areas in the sub-field, but intervals 52 and 54 do not match with these areas.

In this situation, if a method is used whereby supplementary exposure patterns are generated for the areas of low pattern density and no supplementary exposure patterns are generated for areas of high pattern density, on the basis of the pattern density for each area, then supplementary exposure patterns will be generated for the areas marked by the thick lines in FIG. 13, and no supplementary exposure patterns will be generated for the areas marked by the thin lines. Consequently, a problem will arise in that, whilst all the intervals 51–54 lie between the same exposure pattern, some, i.e. 51 and 53, will have a supplementary exposure pattern generated for them and some, i.e. 52 and 54, will not, depending on whether they coincide with the areas. Therefore, since a supplementary exposure pattern will be generated for the region of area A1 in FIG. 13, there will be no problems of narrowing in the developed pattern, but in the region of area A2, no supplementary exposure pattern will be generated, and the problem of narrowing in the developed pattern will occur.

In the present embodiment, data for the pattern existing regions in the areas is generated in order to resolve these problems in the method for generating supplementary exposure patterns on the basis of the pattern density in the areas, and even when the pattern density in an area is high, a supplementary exposure pattern is generated for that area if the distance between adjacent pattern existing regions is greater than a set distance, for example, the size of an area, or the like.

FIG. 14 is an enlarged view of part of the region around area A2 in FIG. 13. The diagram shows six areas amn. FIG. shows an example of area data. In this example, if there are areas a11–aij in the sub-field SFmn, then the area data for each area comprises: area position data X1, Y1, vertical and lateral position data for pattern existing regions in the area, pattern density data for the area, revised pattern density data, flag data indicating whether or not a supplementary exposure pattern has been generated, and flag data indicating whether or not the area is a matrix-positioned sub-field.

In other words, when generating areas amn in a matrix-positioned sub-field, data is created indicating the position of the region where a pattern is existing in each area amn.

Figure 14A:
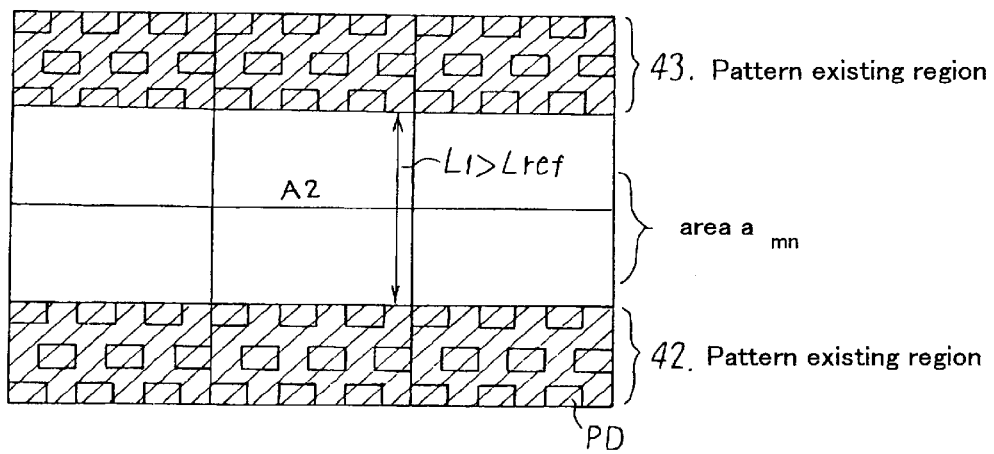
FIG. 14 is an enlarged diagram of a portion of the region around area A2 in FIG. 13.

Therefore, firstly, a supplementary exposure pattern is created depending on the corrected pattern density for the area as explained above, whereupon the pattern existing region is identified by referring to the area data. If one of the pattern existing regions 41–45 in the sub-field is identified, then the distance $L_1$ to the adjacent pattern existing region is calculated with respect to the surrounding areas. As shown in FIG. 14(a), if the distance $L_1$ between the pattern existing regions 42, 43 is greater than a certain reference distance $L_{ref}$, then a supplementary exposure pattern is generated for the surrounding areas.

This reference distance $L_{ref}$ can be set according to the proximity exposure effect, but desirably, it should be of approximately the same size as one area, this being the unit for which a supplementary exposure pattern can be generated. In other words, a new supplementary exposure pattern is generated for regions where areas of low pattern density may occur, depending on a certain matching between the positions of the areas and the pattern existing regions.

Figure 14B:
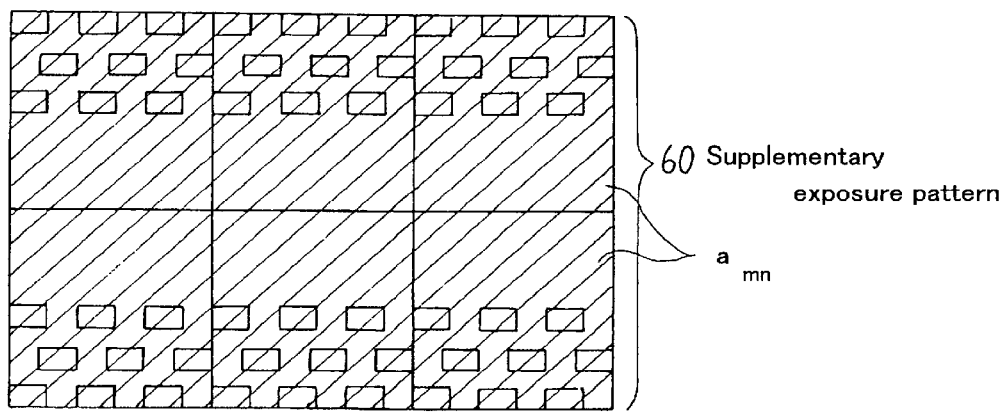

FIG. 14(b) shows a state where a supplementary exposure pattern 60 is generated for six areas $a_{mn}$. The supplementary exposure pattern 60 is newly generated in the hatched region.

Figure 16:
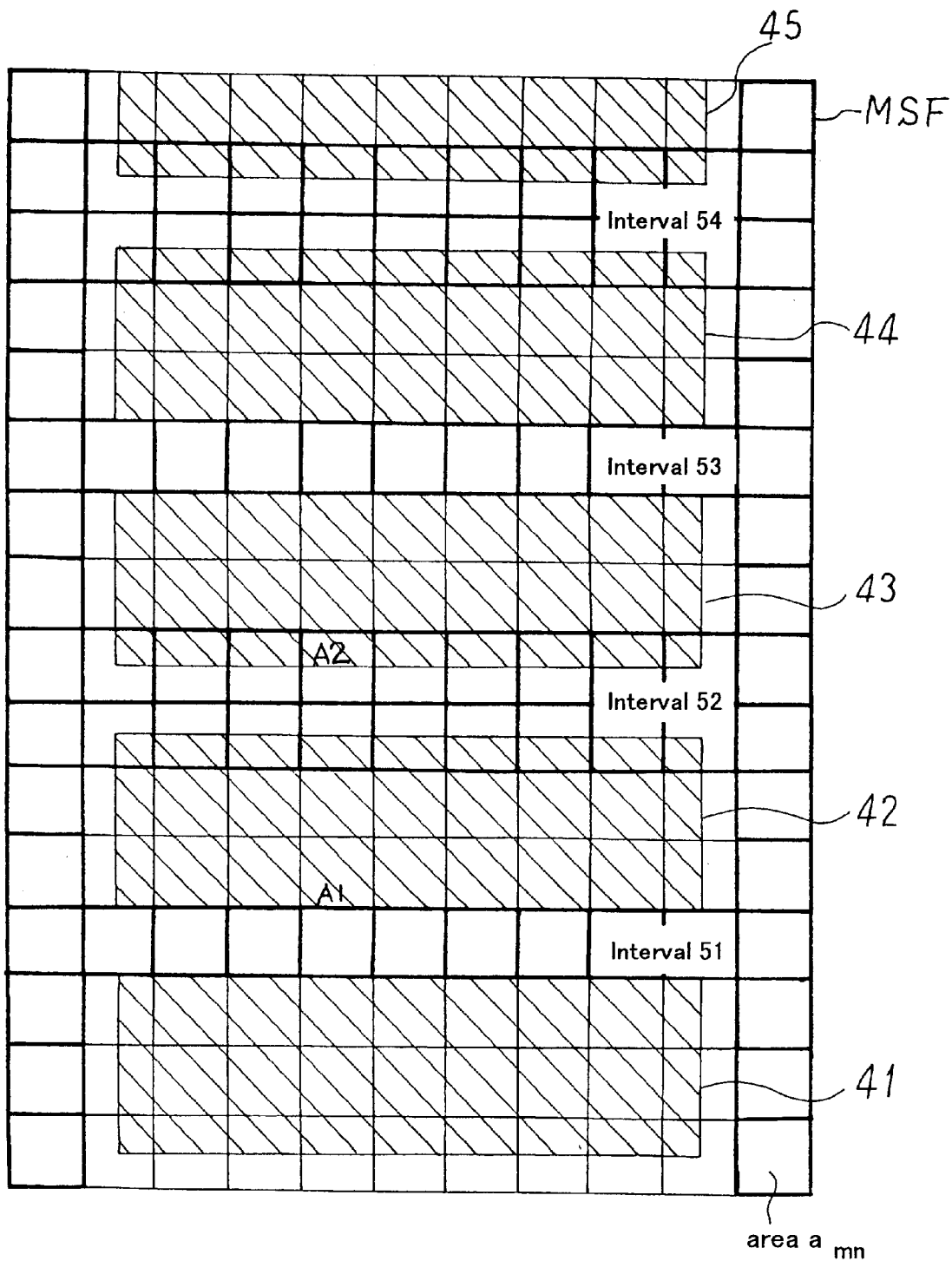
FIG. 16 is a diagram showing a matrix-positioned sub-field in a case where new supplementary exposure patterns are generated.

FIG. 16 illustrates a matrix-positioned sub-field in a case where new supplementary exposure patterns are generated. The thick lines mark the areas where supplementary exposure patterns are created. As is clear from a comparison with FIG. 13, new supplementary exposure patterns are generated in interval 52 between pattern location regions 42 and 43, and in interval 54 between pattern location regions 44 and 45. Consequently, whilst discrepancies arose in the developed patterns at areas A1 and A2 in FIG. 13, in the case in FIG. 16, supplementary exposure patterns are generated in the areas surrounding the pattern existing regions, so there is no discrepancy in the developed patterns in areas A1 and A2, and developed patterns of a suitable size can be obtained.

Figure 17:
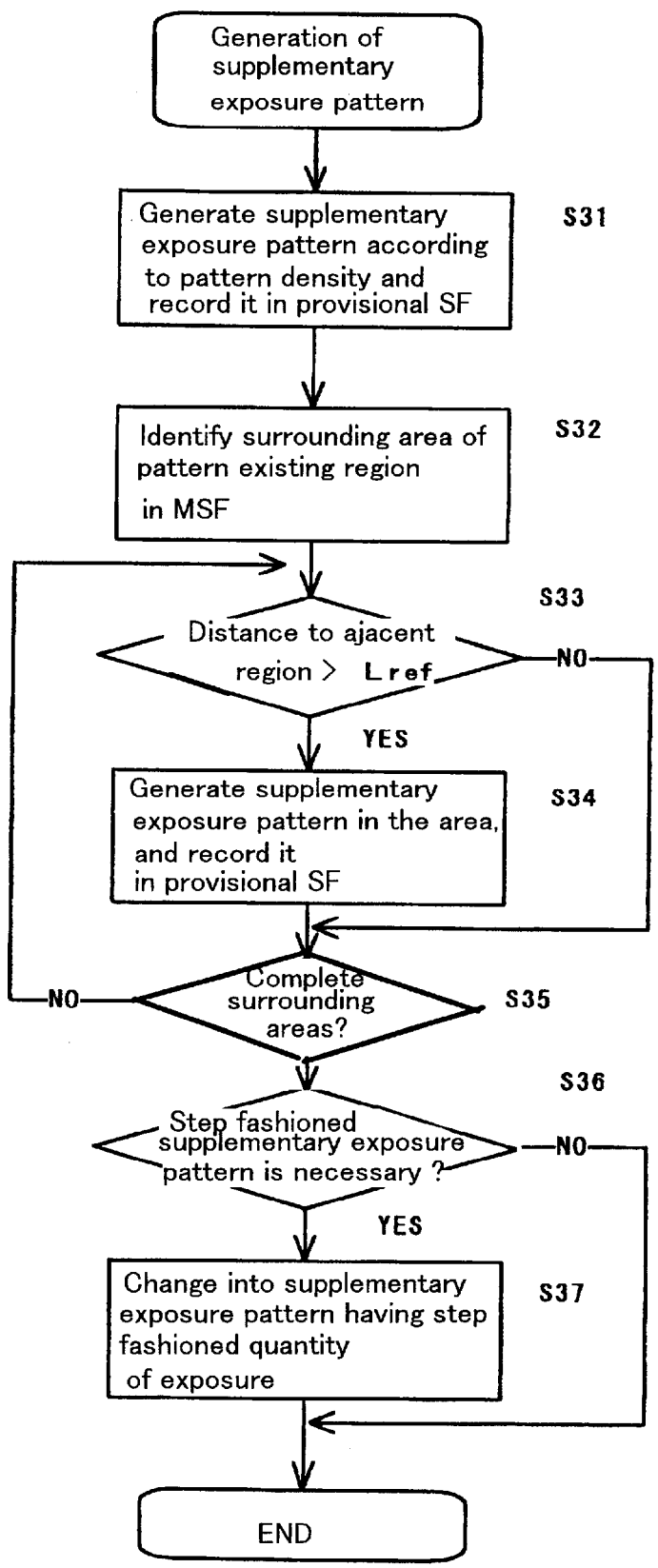
FIG. 17 is a flow-chart of the process of generating a supplementary exposure pattern.

FIG. 17 is a flow-chart of the aforementioned supplementary exposure pattern generating process. This flow-chart shows a portion of step S18 in FIG. 5 in detail. As described above, a supplementary exposure pattern containing a quantity of exposure corresponding to the pattern density in the area is generated in accordance with the correction table illustrated in FIG. 10, and is recorded in a provisional independently positioned sub-field (S31). Thereupon, the areas surrounding the pattern existing regions in the matrix-positioned sub-field are identified (S32). For each of these areas, if the distance $L_1$ to the adjacent pattern existing region is greater than the reference distance $L_{ref}$ (S33), then a supplementary exposure pattern is generated for that area and recorded in a provisional independently positioned sub-field (S34).

[Generating Step Fashioned Supplementary Exposure Pattern]

Generating supplementary exposure patterns produces a proximity exposure effect intentionally, by exposing regions of low exposure pattern density at an energy equivalent to the energy that are lacking for proper developing. Thereby, patterns which do not have exposure patterns surrounding them are prevented for becoming too narrow after developing. The proximity exposure effect is produced by the energy of an electron beam irradiated onto a resist layer spreading into the surrounding region. By creating supplementary exposure patterns for regions of low pattern density, it is possible to supply energy due to the proximity exposure effect to original adjacent exposure patterns, by the spreading of the electron beam energy directed onto these regions. Therefore, the generation of supplementary exposure patterns is based on the premise that there will be a certain degree of spreading of the electron beam energy in the supplementary exposure pattern.

This spreading of the electron beam energy is dependent on the resist material. Usually, the optimum resist material depending on the fineness and density of the pattern to be formed is used. Therefore, the electron beam exposure device is required to generate supplementary exposure patterns which are suitable for different resists.

Figure 18:
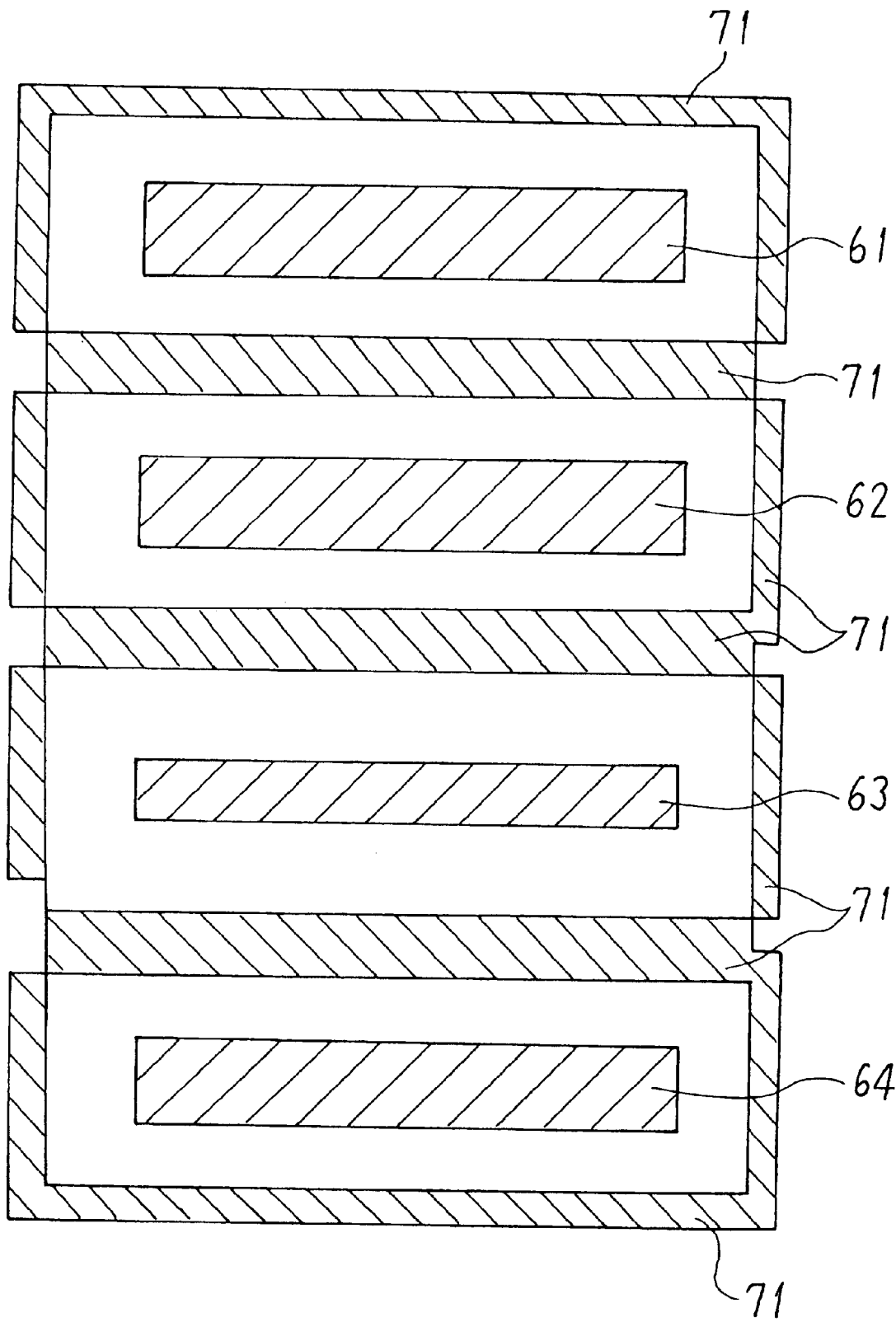
FIG. 18 is a diagram showing a state where supplementary exposure patterns are generated about the perimeter of exposure patterns.

FIG. 18 is a diagram showing the state of a supplementary exposure pattern generated around exposure patterns. In this example, in the region containing the exposure patterns 61–64, a supplementary exposure pattern 71 is generated around these exposure patterns 61–64. For the sake of simplicity, FIG. 18 does not show the generated areas. In the example shown in FIG. 18, the supplementary exposure pattern 71 is created for regions of low pattern density, taking the pattern density of the generated areas as a reference.

In the base of a resist material having electron beam spreading characteristics of a certain level, the energy from the electron beam irradiated onto the supplementary exposure pattern 71 will also spread into the exposure patterns 61–64, thereby preventing narrowing of the pattern. However, by contrast, in a resist material having poor electron beam spreading characteristics, since the position of the supplementary exposure pattern 71 is separated from the exposure patterns 61–64, it is not possible to generate a sufficient proximity exposure effect to these patterns.

Therefore, in the present embodiment, depending on the characteristics of the resist material, the region for which the supplementary exposure pattern is generated may be extended from the areas of low pattern density only, to those areas plus the surrounding areas. Moreover, if it is extended to the surrounding areas, the quantity of exposure Q is set in a step fashion, such that the spreading distribution is equivalent to that obtained when a resist having ideal spreading characteristics is used. The total quantity of exposure is the same as when the supplementary exposure pattern is not extended to the surrounding areas.

Figure 19:
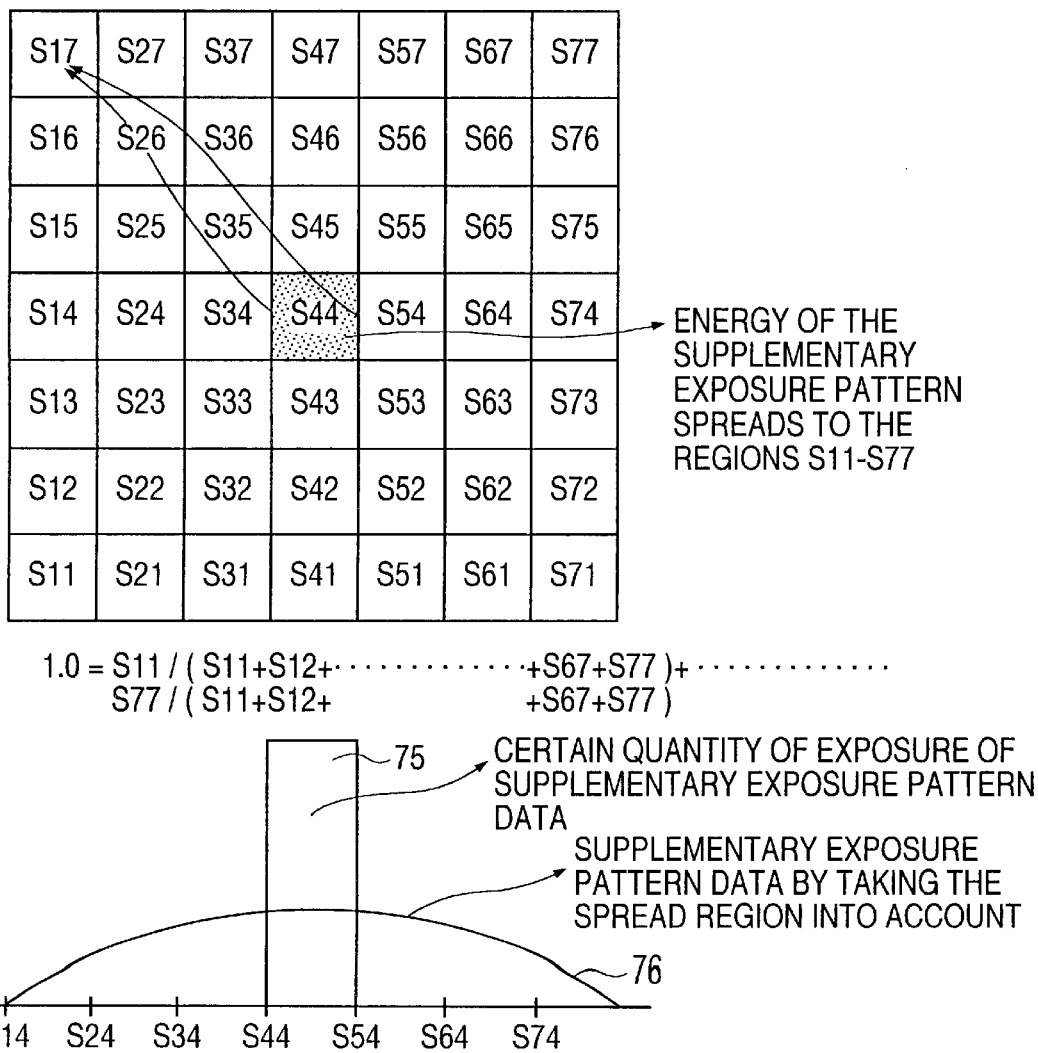
FIG. 19 shows an example of a ratio table which takes the spreading characteristics of supplementary exposure patterns into account.

FIG. 19 shows an example of a ratio table which takes the spreading characteristics of the supplementary exposure pattern into account. This example illustrates a supplementary exposure pattern 76 which takes account of the spreading occurring when a supplementary exposure pattern 75 is created at the center of a 7-row, 7-column configuration of areas. The energy distribution is shown as changing from 75 to 76. It is necessary that, even if the energy spreads, the total energy is the same as the energy for a supplementary exposure pattern generated on a single area.

The matrix in FIG. 19 indicates the ratios $S_{11}$–$S_{77}$, and these ratios satisfy the following equation.

$$1.0 = S_{11}/(S_{11}+S_{12}+ \ldots S_{67}+S_{77}) + \ldots + S_{77}/(S_{11}+S_{12}+ \ldots S_{67}+S_{77})$$

As the above clearly shows, depending on the resist material, it is necessary to generate a supplementary exposure pattern comprising a stepped quantity of exposure, in order that a quantity of exposure distribution 76 which takes account of spreading is achieved.

Figure 20:
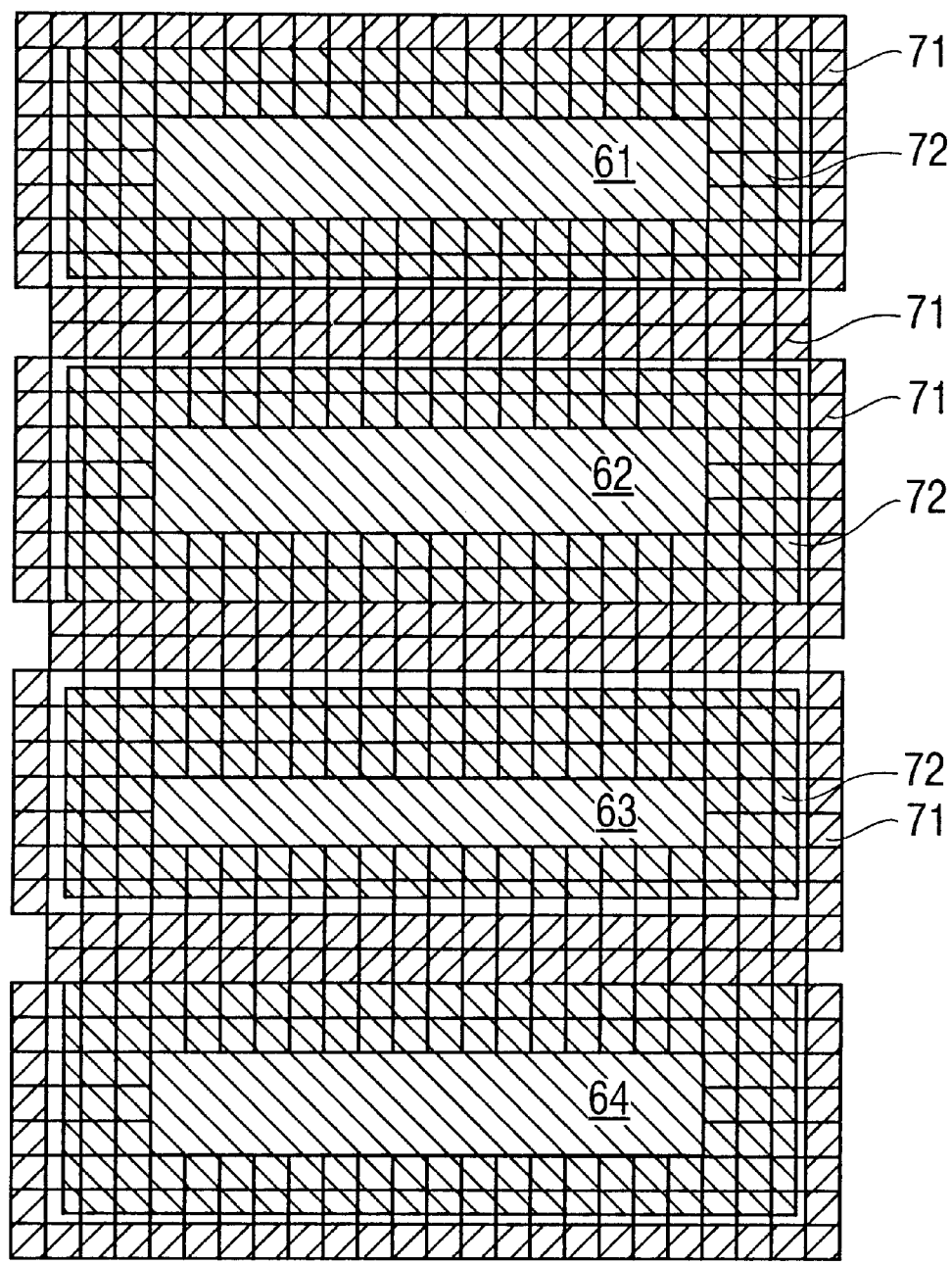
FIG. 20 is a diagram showing an example where the supplementary exposure patterns in FIG. 18 are set as supplementary exposure patterns having a step-shaped quantity of exposure distribution.

FIG. 20 shows an example where the supplementary exposure pattern in FIG. 18 is used as a supplementary exposure pattern comprising a stepped quantity of exposure. As well as the supplementary exposure pattern 71 in FIG. 18, an additional supplementary exposure pattern 72 is generated between the exposure patterns 61–64 and the supplementary exposure patterns 71. The quantity of exposure for the additional supplementary exposure pattern 72 is set to a figure less than that for the supplementary exposure pattern 71, such that the total quantity of exposure does not increase. In the example in FIG. 20, the quantity of exposure for the supplementary exposure pattern 71 is weaker than it is in FIG. 18, and the quantity of exposure for the additional supplementary exposure pattern 72 is weaker still.

In an actual exposure device, it is possible to select between a case where only a supplementary exposure pattern 71 as in FIG. 18 is created, and a case where supplementary exposure patterns 71 and 72 as in FIG. 20 are created, depending on the resist material used. Furthermore, in the event of an increase in the number of resist types, it is possible to generate a plurality of different supplementary exposure patterns comprising a step-shaped quantity of exposure, each producing a different level of spreading.

The step of generating supplementary exposure patterns as described above is also shown in the flow-chart in FIG. 17. At step S36, depending on the resist material, if it is necessary to generate a step-shaped supplementary exposure pattern in order to obtain spreading characteristics, the uniformly generated supplementary exposure pattern is changed to a supplementary exposure pattern comprising a stepped quantity of exposure (S37). Therefore, the changed supplementary exposure pattern will cover more areas. As described previously, the supplementary exposure pattern modified in this way is appended as pattern data in a provisional independently positioned sub-field. Consequently, the quantity of exposure in this pattern data has a step-shaped distribution.

Figure 21:
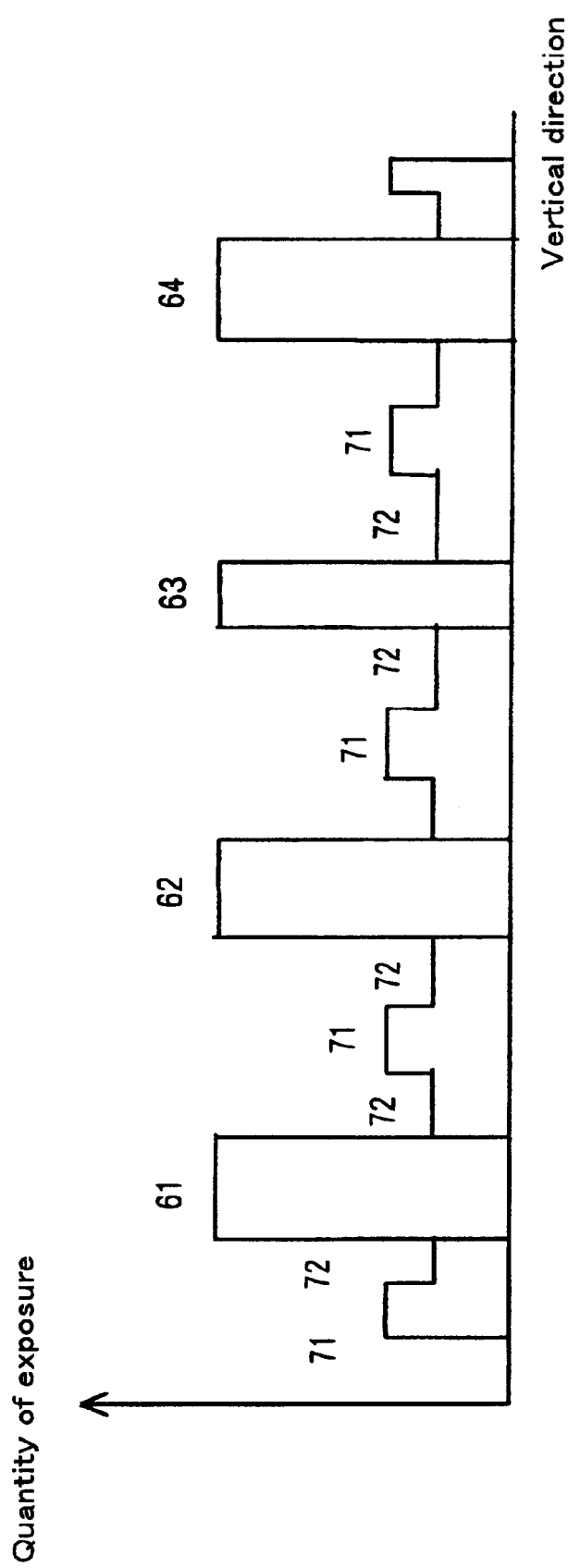
FIG. 21 is a diagram showing the quantity of exposure distribution of the supplementary exposure patterns in FIG. 20, where the quantity of exposure distribution is shown with respect to the vertical direction in FIG. 20.

FIG. 21 shows the quantity of exposure distribution for the supplementary exposure pattern in FIG. 20. The quantity of exposure distribution is shown with respect to the vertical direction in FIG. 20. The original exposure patterns 61–64 to be developed receive a high quantity of exposure, whilst the supplementary exposure patterns 71 therebetween receive a lower quantity of exposure. The additional supplementary exposure patterns 72 receive an even lower quantity of exposure.

[Generating areas matching to the patterns]

In the present embodiment, areas are generated in a sub-field, the pattern density in these areas is determined, and the pattern density is then determined again taking account of the effect of patterns in surrounding areas, whereupon supplementary exposure patterns are generated with reference to this newly corrected pattern density. The supplementary exposure patterns are based on the unit of an area.

However, if there is poor matching between the exposure pattern which is actually to be developed and a supplementary exposure pattern based on area units, then even if the same exposure pattern is used, different supplementary exposure patterns may be produced.

Figure 22:
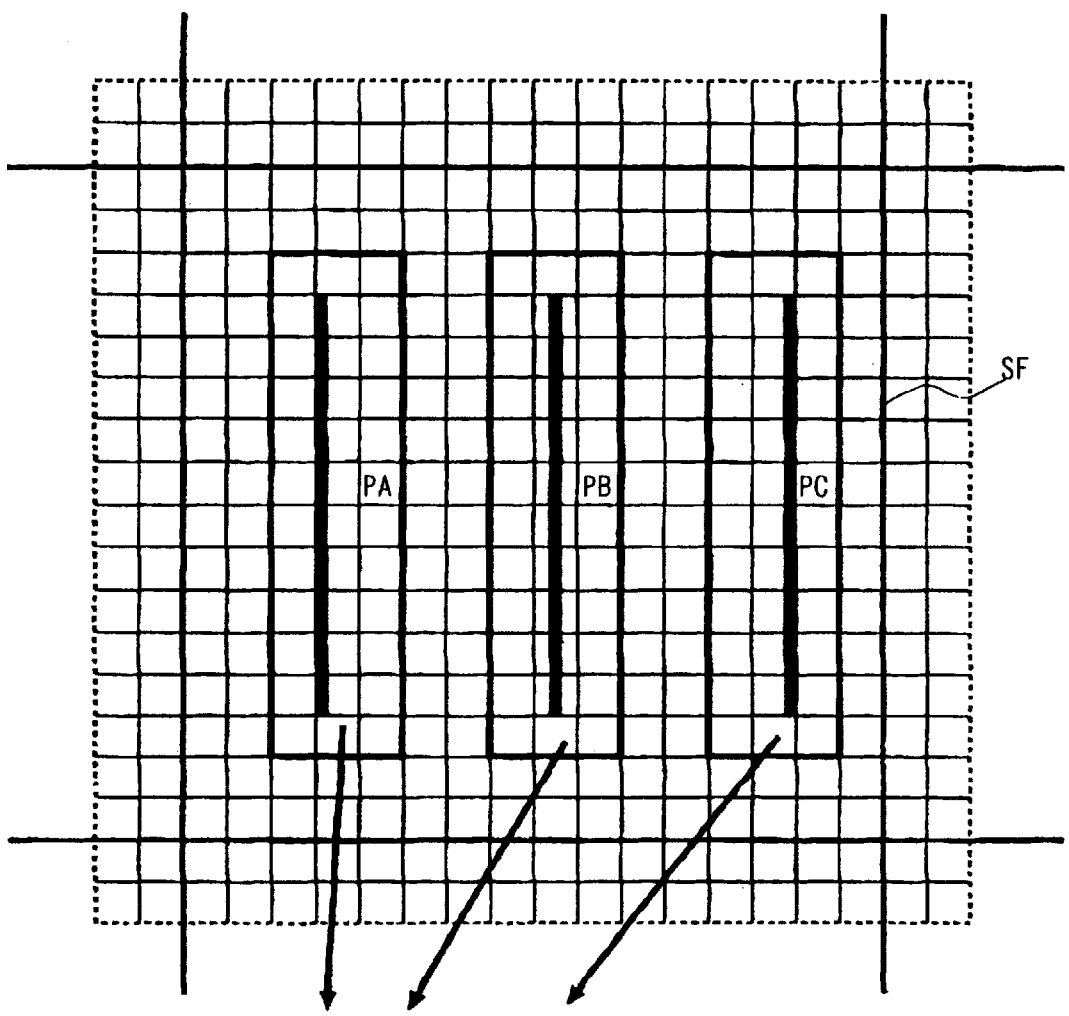
FIG. 22 is a diagram showing supplementary exposure patterns generated with respect to exposure patterns in a sub-field.

FIG. 22 illustrates supplementary exposure patterns generated with respect to exposure patterns in a sub-field. In this example, there are three exposure patterns PA, PB, PC in the sub-field SF, and supplementary exposure patterns as marked by the thick lines are generated in the regions surrounding the exposure patterns. The respective supplementary exposure patterns have a size covering twelve rows and three columns of areas.

As shown in the diagram, the exposure patterns PA, PB, PC are set to the same exposure density. However, pattern PA is positioned on the left-hand edge of areas, whilst pattern PB is positioned in the center of areas, and pattern PC is positioned on the right-hand edge of areas. Therefore, the supplementary exposure pattern generated for pattern PB will have lateral symmetry with respect to pattern PB. However, the supplementary exposure patterns generated with respect to patterns PA and PC will not have lateral symmetry with respect to these patterns. This problem arises from the fact that the areas are generated without regard to the position of the exposure patterns.

Therefore, in the present embodiment, areas which are dependent on the position of the patterns are generated. For this purpose, the regions in which patterns are located are determined, and areas are created surrounding these pattern location regions in point symmetry about the center or center of gravity thereof. Moreover, these surrounding areas are generated up to a range within which a proximity exposure effect is produced. In the region outside this, even if the original areas are generated, since no patterns are present, it is not actually necessary to generate supplementary exposure patterns, and therefore the areas themselves do not need to be created.

Figure 23:
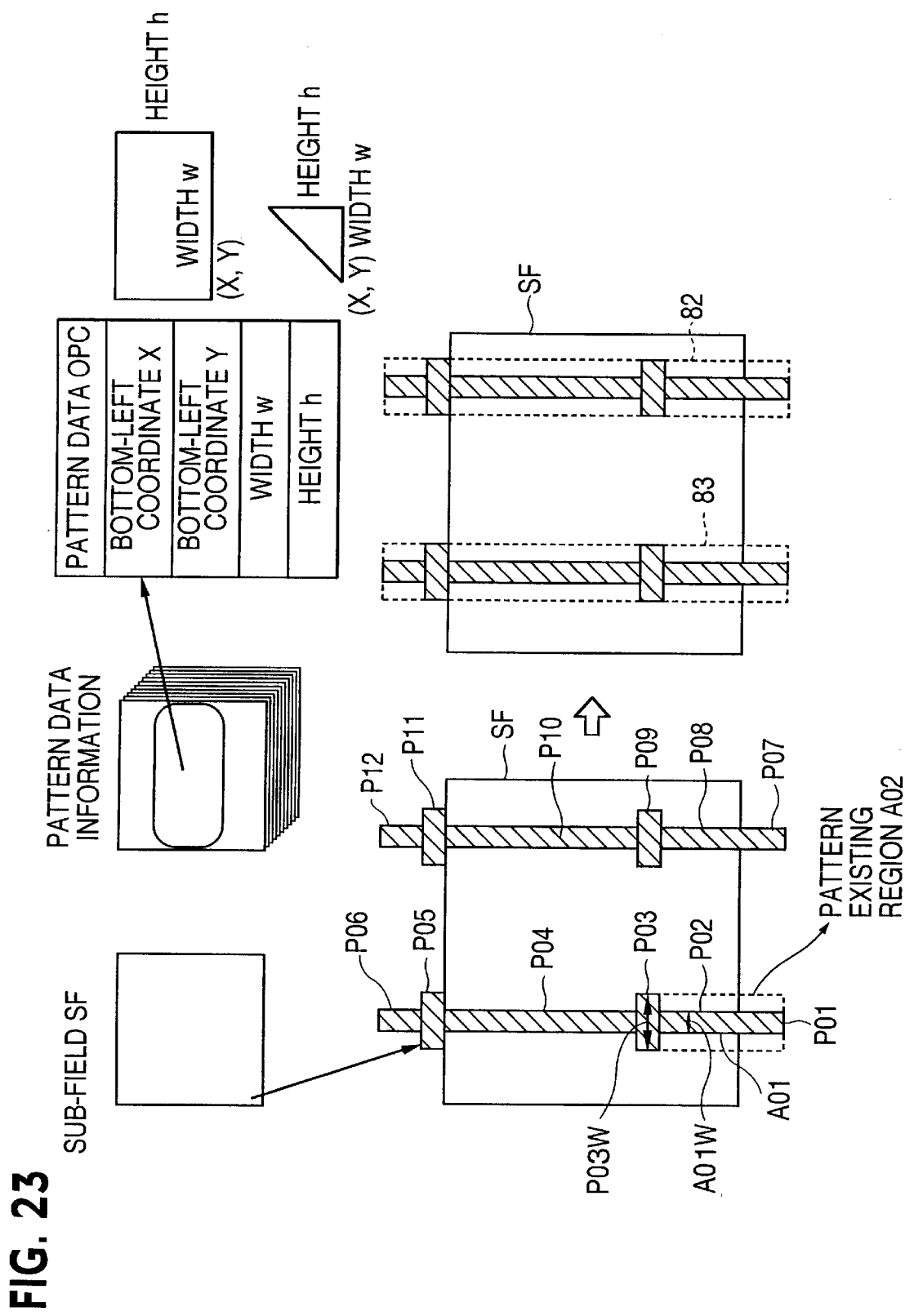
FIG. 23 is a diagram illustrating a method for detecting regions where exposure patterns are located in a sub-field.
Figure 24:
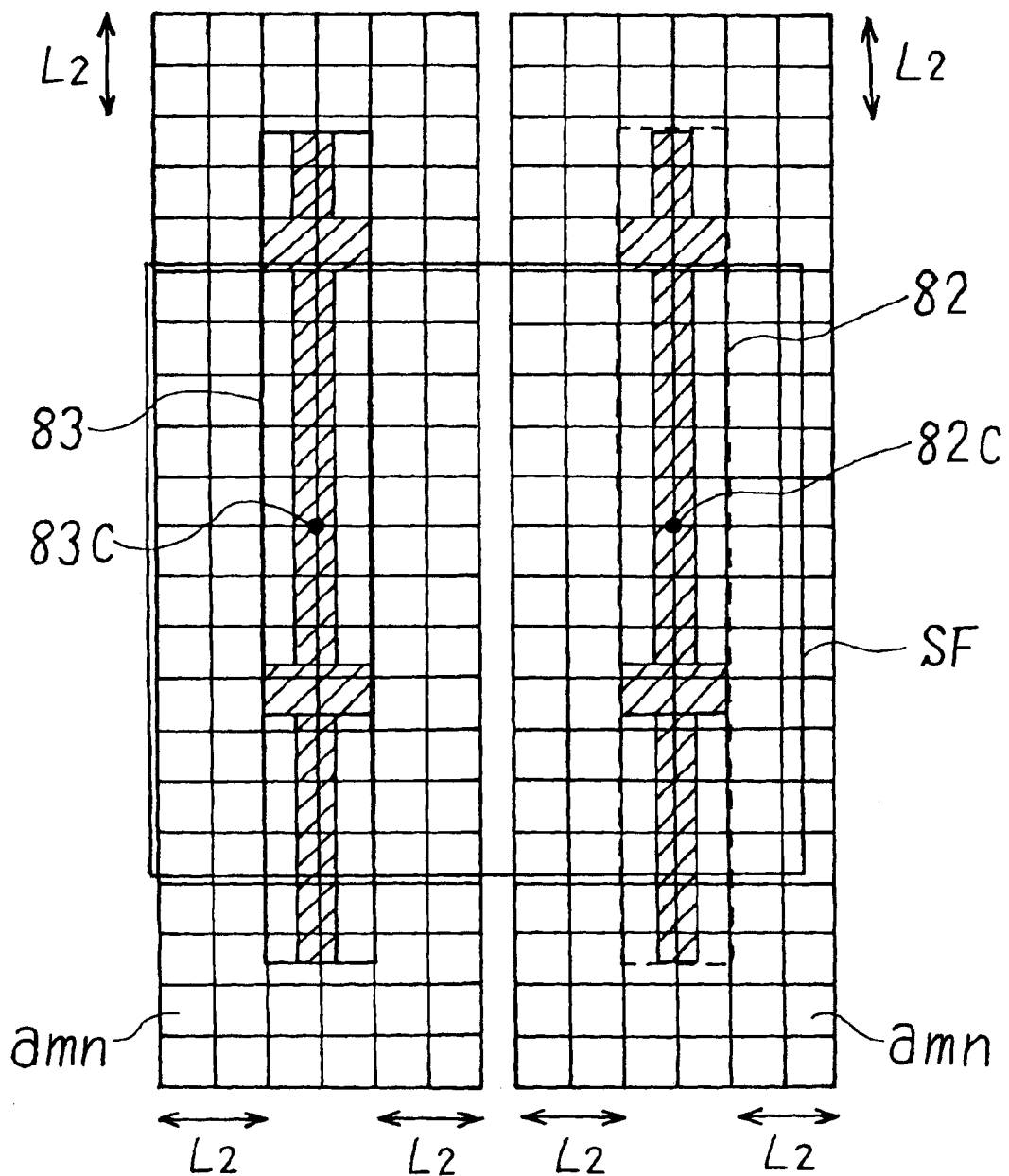
FIG. 24 is a diagram illustrating a method for generating areas matching the detected pattern location regions.

FIG. 23 illustrates a method for detecting the regions in which exposure patterns are located in a sub-field, and FIG. 24 illustrates a method for generating areas which match the detected pattern location regions. In the example in FIG. 23, there are two pattern groups in the sub-field SF.

Firstly, as shown in FIG. 23, the pattern data comprises the bottom-left co-ordinates of the pattern (x,y), and the width w and height h of the pattern. If areas are generated in a particular sub-field SF, the pattern data in that sub-field SF and the pattern data in adjacent sub-fields is read out from the design data. Thereupon, since patterns p01 and p02 are adjacent, as shown in FIG. 23, a pattern existing region A01 combining these patterns is created. The pattern existing region A01 is also combined with the neighbouring pattern p03. In this case, the respective widths A01W and p03W are compared, and the larger width p03W is defined as the width of a new pattern existing region A02.

By applying this algorithm to all of the pattern data read out, two pattern existing regions 82, 83 are created in the sub-field SF, as shown by the dotted lines in FIG. 23. In this example, the pattern existing regions 82, 83 extend beyond the region of the sub-field SF. When generating pattern existing regions by combining a plurality of patterns, it is not necessary for the plurality of patterns to be adjacent, but rather patterns can be combined as a pattern existing region if they are positioned within a prescribed distance of each other.

FIG. 24 shows a state where areas matching the pattern existing regions 82, 83 are generated, respectively. Taking the respective central points 82C, 83C of the two pattern existing regions 82, 83 created in the sub-field SF as starting points, areas amn are generated respectively in point symmetry. The region in which areas are generated in this case should extend from the pattern existing regions 82, 83 to the exposure effect range $L_2$. In the example in FIG. 24, the two pattern existing regions 82, 83 are separated by a distance equal to twice the exposure effect range $L_2$ or above. Consequently, there is no overlapping between the areas generated in these respective pattern existing regions 82, 83.

Whilst there exists a region within the sub-field SF where no areas are generated, this does not present a problem, since this region is not actually affected by the beam exposure, so the pattern density in this region is zero and it requires no supplementary exposure pattern to be generated.

Furthermore, if the pattern existing regions 82, 83 are closer than twice the exposure effect range $L_2$ to each other, they are combined to form a new pattern existing region, thereby preventing duplication of supplementary exposure patterns for these respective areas.

Figure 15:
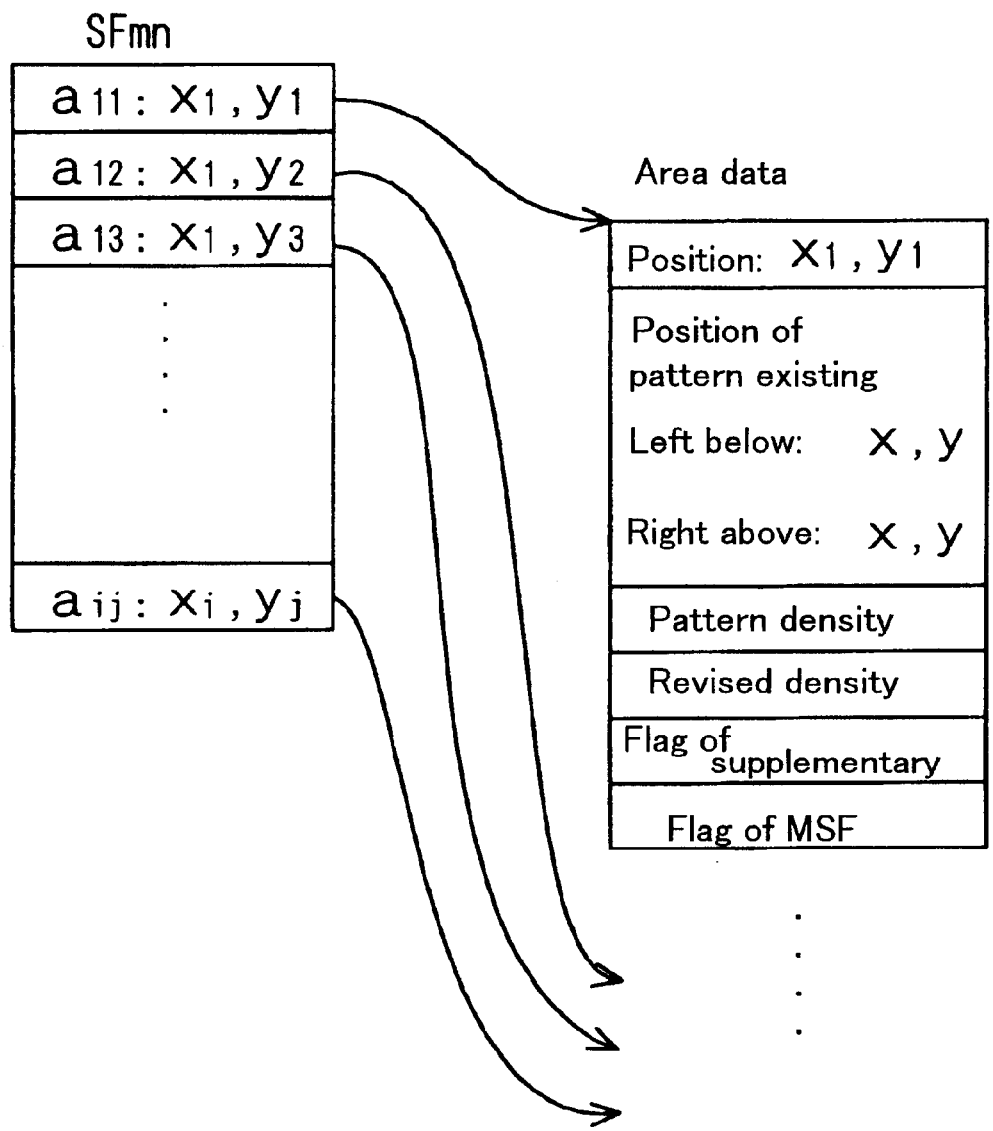
FIG. 15 is a diagram showing an example of area data.

Alternatively, if the generated areas overlap in the two pattern existing regions, then by using a flag indicating whether or not a supplementary exposure pattern has been generated in the area data illustrated in FIG. 15, it is possible to prohibit generation of a new supplementary exposure pattern for an area where one has already been generated. Since the quantity of exposure in the supplementary exposure pattern itself is small, a further alternative is to allow a certain degree of overlapping between supplementary exposure patterns, and to process the data such that the total quantity of exposure for a particular area does not exceed a certain threshold value.

As shown in FIG. 24, by generating areas matching the respective pattern existing regions, supplementary exposure patterns based on area units can be matched with the patterns, thereby avoiding problems as illustrated in FIG. 22.

[Proximity exposure effect between areas]

In a method according to the present embodiment for generating supplementary exposure patterns which take the proximity exposure effect into account, the supplementary exposure patterns are formed on the basis of the pattern density of the areas generated in the sub-field. The pattern density within these areas comprises the density of the pattern actually present and, additionally, the effect due to the proximity exposure effect from the patterns in surrounding areas. In this case, as shown in FIG. 8, in order to detect the scale of the exposure effect from the patterns in surrounding areas, the exposure pattern density in these surrounding areas is multiplied by a coefficient based on the distance, r, to the area in question, for example, $1/(1+r)$.

Figure 25:
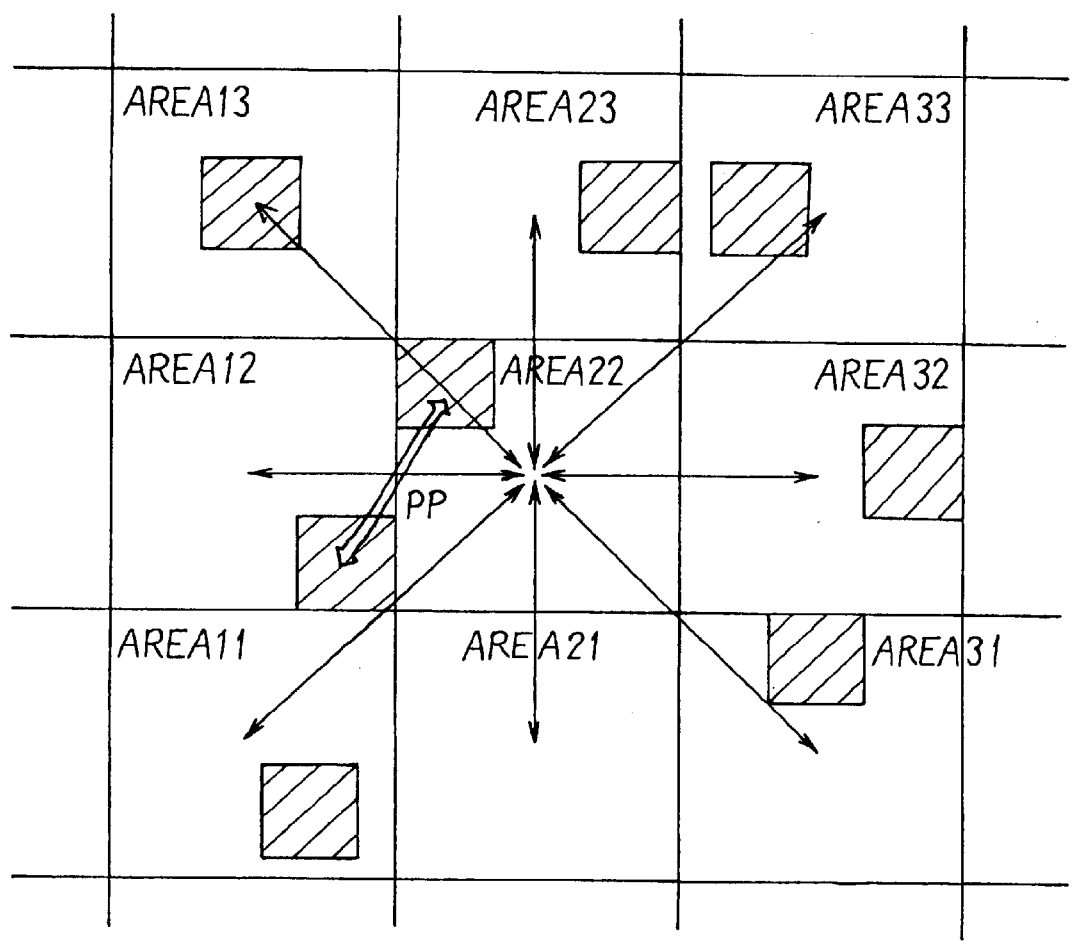
FIG. 25 is a diagram illustrating a process for detecting the scale of exposure effects on an area AREA22 at the center of a 3-row, 3-column configuration of areas, AREA11–AREA33.

FIG. 25 illustrates a process of detecting the scale of the exposure effect on the AREA 22 in a three-row, three-column configuration of areas, AREA11–AREA33. In this example, the distance between the areas is taken simply as the distance between the centers of the areas. However, in practice, the patterns are not located evenly in the areas. In the example shown in FIG. 25, in AREA11, the pattern is located at the bottom right of the area, whilst in AREA32, the pattern is located at the right-hand edge of the area. Therefore, if the scale of the exposure effect is determined from the surrounding areas using the distance between the centers of the areas, it is not possible to determine the actual scale of the exposure effect accurately.

Therefore, in the present embodiment, in order to determine the scale of the exposure effect from patterns in surrounding areas more accurately, the pattern existing region is detected for each area, and the distances between the centers of gravity (or the centers) of these pattern existing regions are used. As described in relation to FIG. 15, each item of area data contains the bottom left co-ordinate data and top right co-ordinate data for the region where the pattern is located in that area, in addition to the positional co-ordinates for the area. Therefore, the regions where the patterns are located are set as pattern existing regions, and the distance between the centers of gravity of these regions is used as the distance between the areas.

Figure 26:
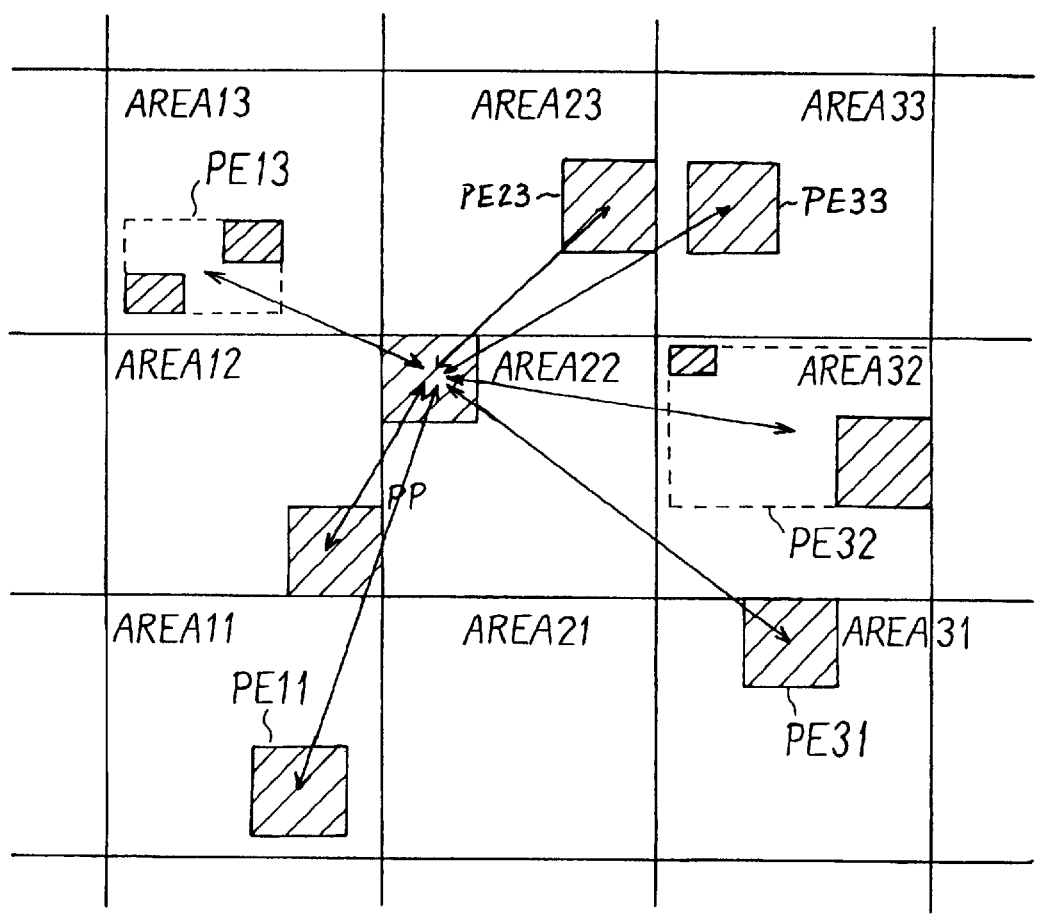
FIG. 26 is a diagram showing a case where the distances between the pattern location regions within areas are used.

FIG. 26 illustrates a case where the distance between the pattern location regions in areas is used. In this example, each of areas AREA11, 12, 22, 23, 31 and 33 contain a single pattern, and areas AREA32 and 13 contain a plurality of patterns. Therefore, in areas AREA11, 12, 22, 23, 31, 33. the patterns themselves are taken as the pattern existing regions PE. In AREA32 and 13, a rectangular region containing the plurality of patterns is set as the pattern existing region PE, and the center of gravity of this region is used.

Therefore, as shown in FIG. 26, the position of the area in question AREA22 is regarded as the position of the center of gravity of the patterns (same of central position of patterns), and using the distances therefrom to the centers of gravity of the pattern existing regions in the respective surrounding areas, the scale of the exposure effect is calculated, and the pattern density is corrected. As a result, it is possible to detect the scale of the exposure effect more accurately, and hence the pattern density of the areas which are used as the reference for generating supplementary exposure patterns can be determined more accurately.

[Calculating matrix-positioned sub-fields]

Matrix-positioned sub-fields are generated in regions containing a repeated pattern only, as in a memory cell region of an integrated circuit, for example. In this case, the matrix-positioned sub-fields generated by repetition comprise a reference sub-field (matrix-positioned reference sub-field) at the head of the exposure order, followed by matrix-positioned sub-fields indicating the same pattern data address. Independently positioned sub-fields are positioned adjacently or in a partially overlapping fashion at the perimeter of this matrix-positioned region.

In general, a matrix-positioned sub-field generated in a region of high density, such as a memory cell region, contains high-density patterns. Therefore, it is often the case that supplementary exposure patterns do not need to be generated in these matrix-positioned sub-fields.

In the present embodiment, if no supplementary exposure patterns are generated for the matrix reference sub-field by carrying out the calculations in steps S13–S18 in FIG. 5, then it is determined that no supplementary exposure patterns will be generated for the subsequent matrix-positioned sub-fields, either, and pattern data is not read in or calculated for these matrix-positioned sub-fields. However, in the boundary portion of a matrix-positioned sub-field, the pattern density is often low, and therefore pattern data is read in for this region, the pattern density is detected and a supplementary exposure pattern is generated, if necessary.

Figure 27:
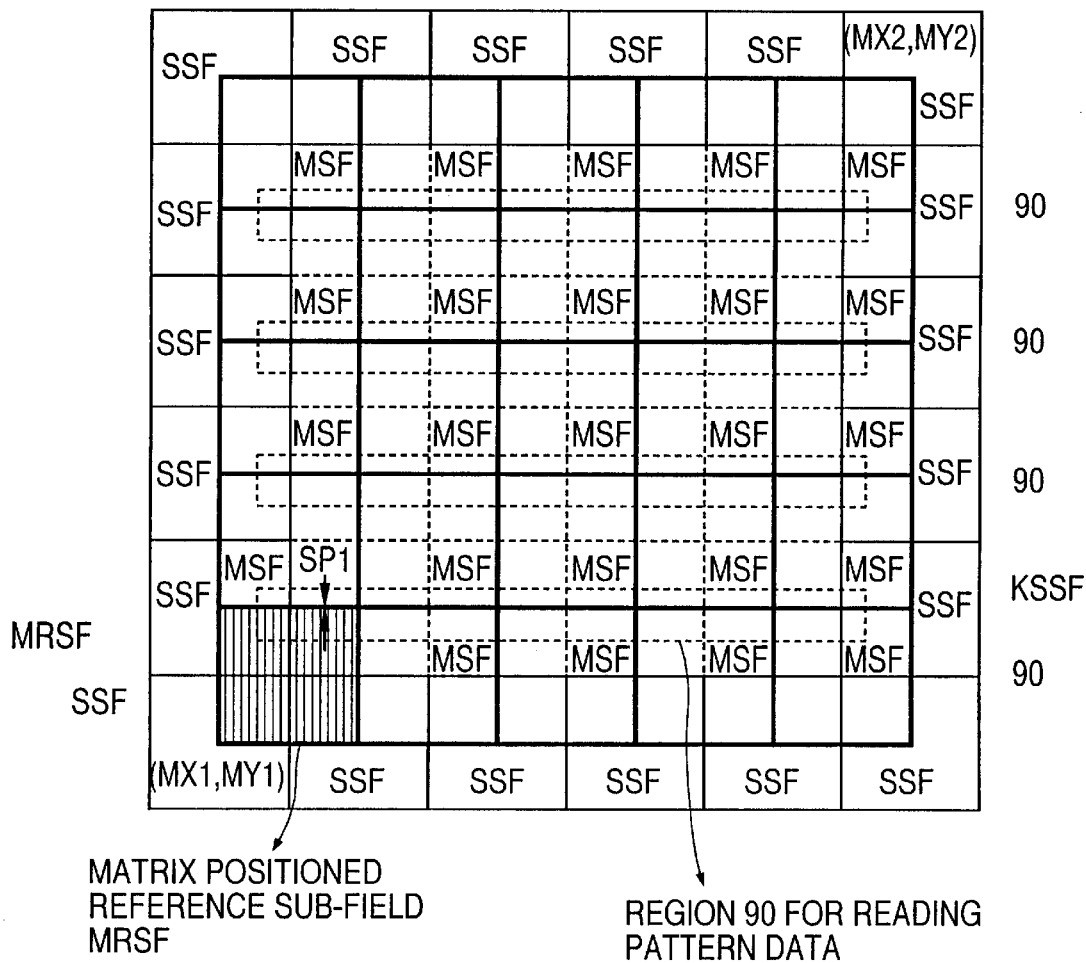
FIG. 27 is a diagram showing an example of matrix-positioned sub-fields.

FIG. 27 shows an example of matrix-positioned sub-fields in a case matching the foregoing description. In this example, the matrix-positioned sub-fields MSF are arranged by repetition in a 5-row, 5-column configuration. The leading matrix-positioned sub-field is taken as the matrix-positioned reference sub-field MRSF. Independently positioned sub-fields SSF are positioned around the edge of the matrix-positioned sub-fields such that they overlap partially therewith. Furthermore, provisional independently positioned sub-fields KSSF are provided in regions matching the independently positioned sub-fields (fields marked by broken line in diagram).

In this example, in order to achieve maximum reduction of the calculation time required for generating supplementary exposure patterns, taking proximity exposure effects into account, areas are generated in the matrix-positioned reference sub-field MRSF, the patterns are read out, the pattern density in the areas is determined, and it is judged whether or not a supplementary exposure pattern is required. In the case of high-density matrix-positioned sub-fields, it is hardly ever necessary to form a supplementary exposure pattern.

Furthermore, in cases where the priority is to reduce the calculation time, even if there is some decline in the accuracy of exposure, then a calculation is implemented to determine whether or not a supplementary exposure pattern is required for the matrix-positioned reference sub-field MRSF only, and if a supplementary exposure pattern is not required, the calculations for the remaining matrix-positioned sub-fields are omitted. The ratio $\alpha$ for reducing the quantity of exposure for portions of high pattern density as determined for the matrix-positioned reference sub-field MRSF is also applied to the remaining matrix-positioned sub-fields.

However, in the case of matrix-positioned sub-fields, the pattern density may be lower in the boundary regions thereof, and therefore the pattern data for the regions 90 in the drawing is read, the pattern density in these areas is determined, and it is judged whether or not it is necessary to generate supplementary exposure patterns. By reducing the volume of pattern data read in, the calculation time is shortened. The regions 90 are the boundary regions of the matrix-positioned sub-fields MSF in a horizontal direction, but it is also necessary to read in pattern data for the boundary regions of the matrix-positioned sub-fields MSF in a vertical direction, similarly.

[Block mask]

Figure 28:
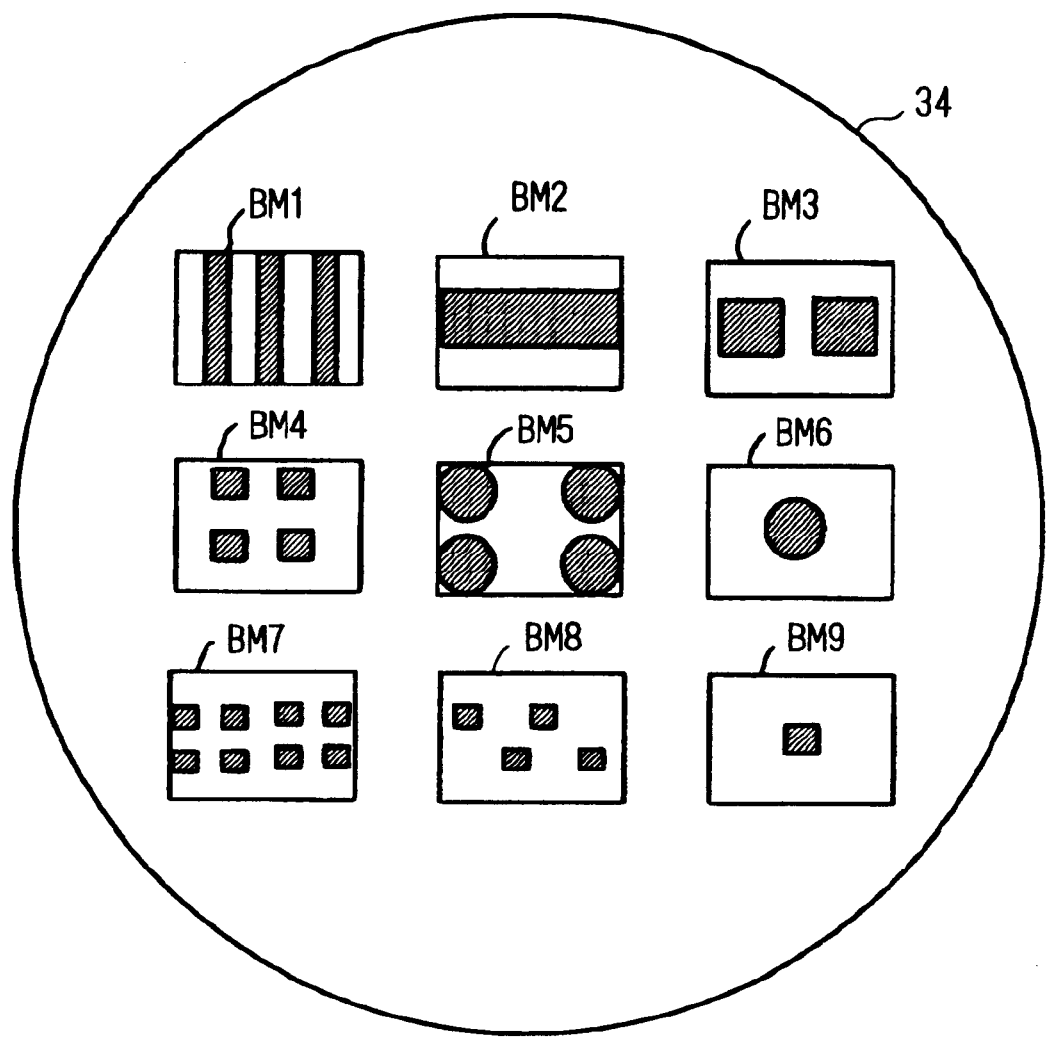
FIG. 28 is a diagram showing an example of a transmission mask 34 comprising block masks.

Next, a brief description is given of an electron beam exposure process using a block mask. FIG. 28 shows examples of a transmission mask 34 comprising block masks. In this example, nine block masks BM1–BM9 are provided. The block masks comprise, for example, a plurality of patterns inside a broad region of 5 $\mu$m×5 $\mu$m. However, block mask BM9 in the example shown in FIG. 28 comprises a single rectangular pattern and is employed for exposure using a standard variable rectangular beam.

As shown in FIG. 1, an electron beam transmitted via a rectangular mask 32 is reflected to a desired block mask BM region of transmission mask 34, in accordance with the mask deflector 33, such that an electron beam of the corresponding pattern shape is irradiated onto the wafer.

Figure 29:
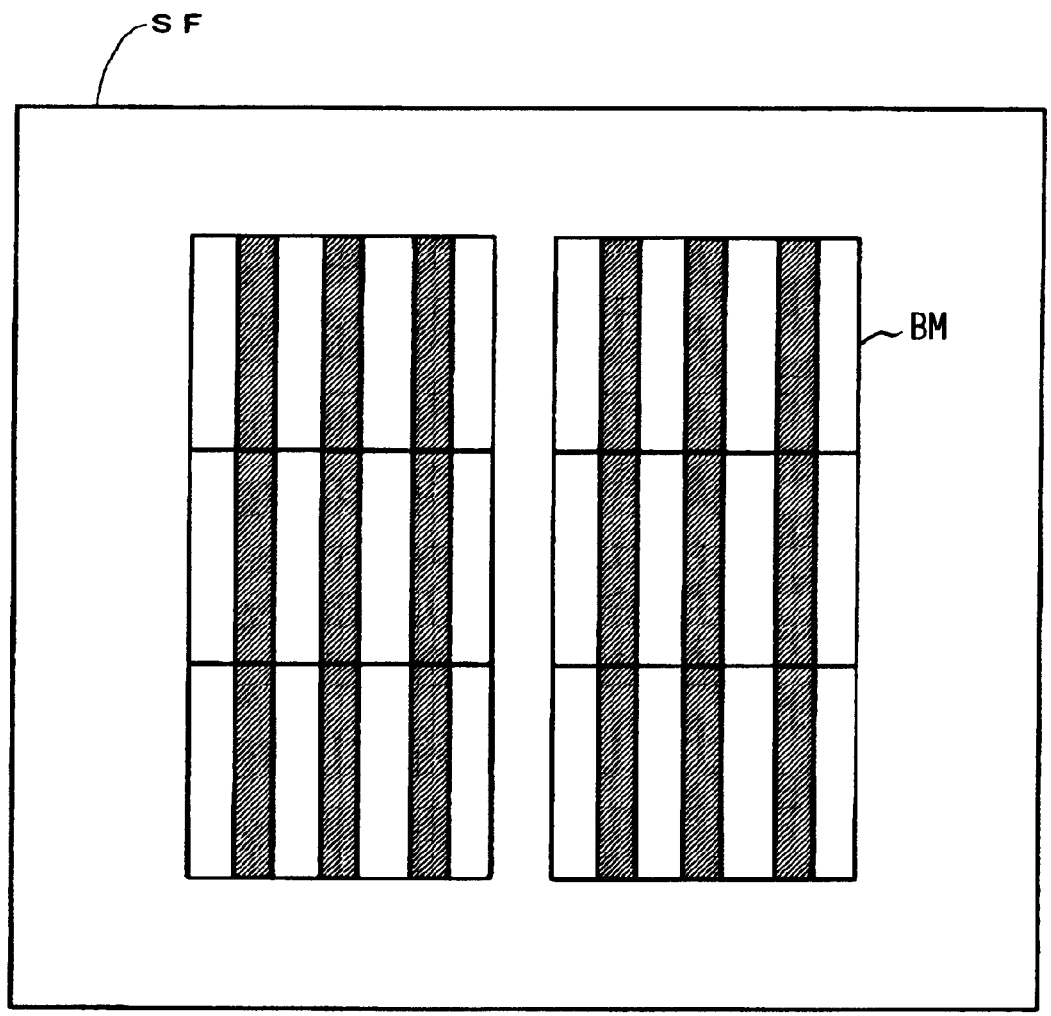
FIG. 29 is a diagram of a sub-field comprising a pattern formed using a block mask.

FIG. 29 shows a sub-field containing patterns formed using a block mask. In this example, a striped pattern is formed in the sub-field SF by six shot cycles using block mask BM1.

When exposing a wafer using a block mask, as illustrated in FIG. 29, the generation of areas, determination of area pattern densities, and the correction of the light quantities and generation of supplementary exposure patterns can all be handled in a similar manner to standard patterns, by treating the pattern existing regions of the block mask as quasi-patterns.

Figure 30:
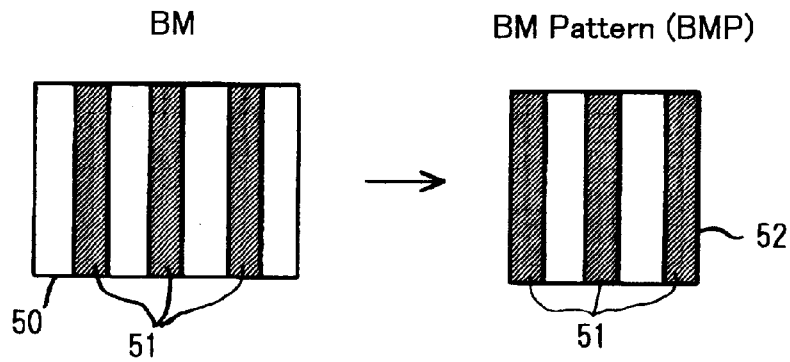
FIG. 30 is a diagram showing an example where patterns formed using a block mask are set as a block mask pattern.

FIG. 30 shows an example wherein the pattern formed by a block mask is set as a block mask pattern. In this example, a block mask BM containing a three-striped pattern 51, also comprises regions 50. However, patterns are not present on both sides of these regions 50, so as shown on the right-hand side of FIG. 30, the block mask pattern is reduced to the region 52 where patterns are present. The pattern density D of this block mask pattern is then determined.

The block mask pattern BMP derived in this way contains a pattern density D in addition to the standard pattern data comprising: position (x,y), width w, height h and quantity of light Q.

Figure 31:
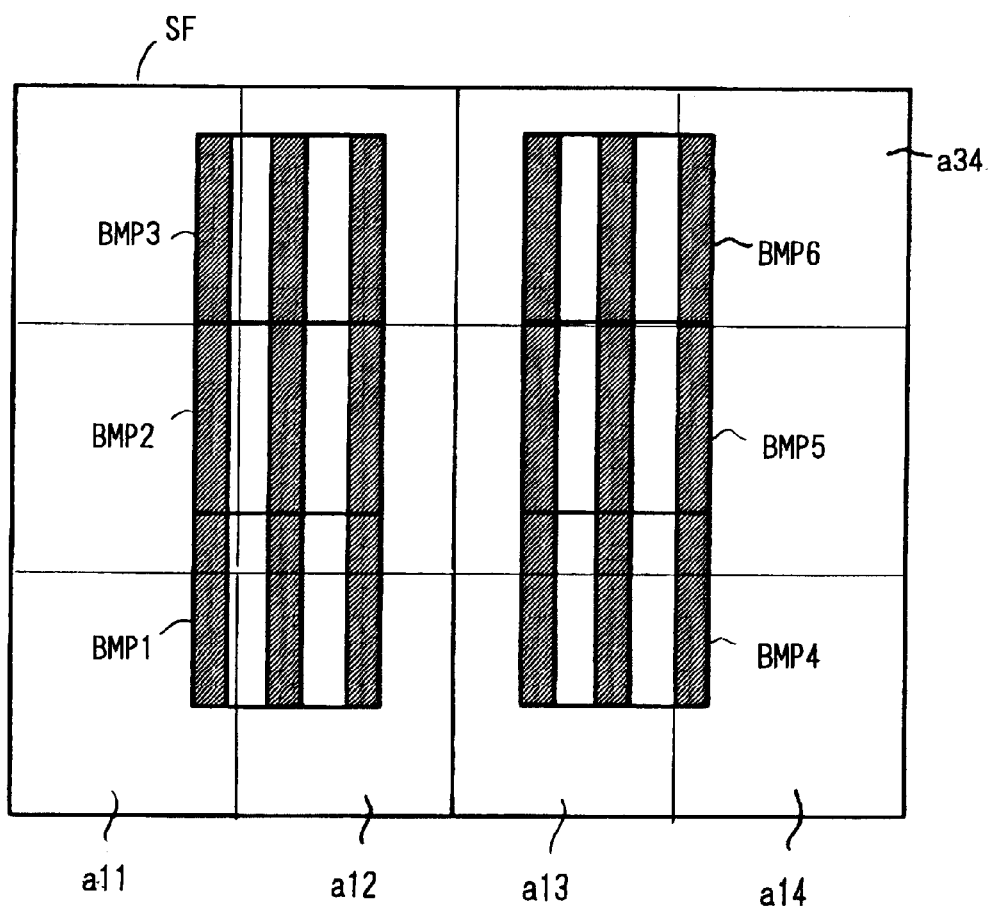
FIG. 31 is a diagram showing block mask patterns BMP 1–6 located in a sub-field SF and areas a11–a34 generated in this sub-field SF.

FIG. 31 illustrates block mask patterns BMP 1–6 in a sub-field SF, and areas a11–a34 generated in the sub-field. In this example, the block mask pattern BMP1 is located in area a11 and area a12. Therefore, when determining the pattern density in area a11, a surface area $S2(=S1 \times D)$ derived by multiplying the surface area S1 of the block mask pattern BMP1 in area a11 by the density D of the block mask pattern BMP1 is used. Thereby, it is possible to correct the quantity of exposure and produce a supplementary exposure pattern by generating an area pattern density, in the same way as for standard patterns, even when the pattern data contains a mixture of block masks.

Figure 32:
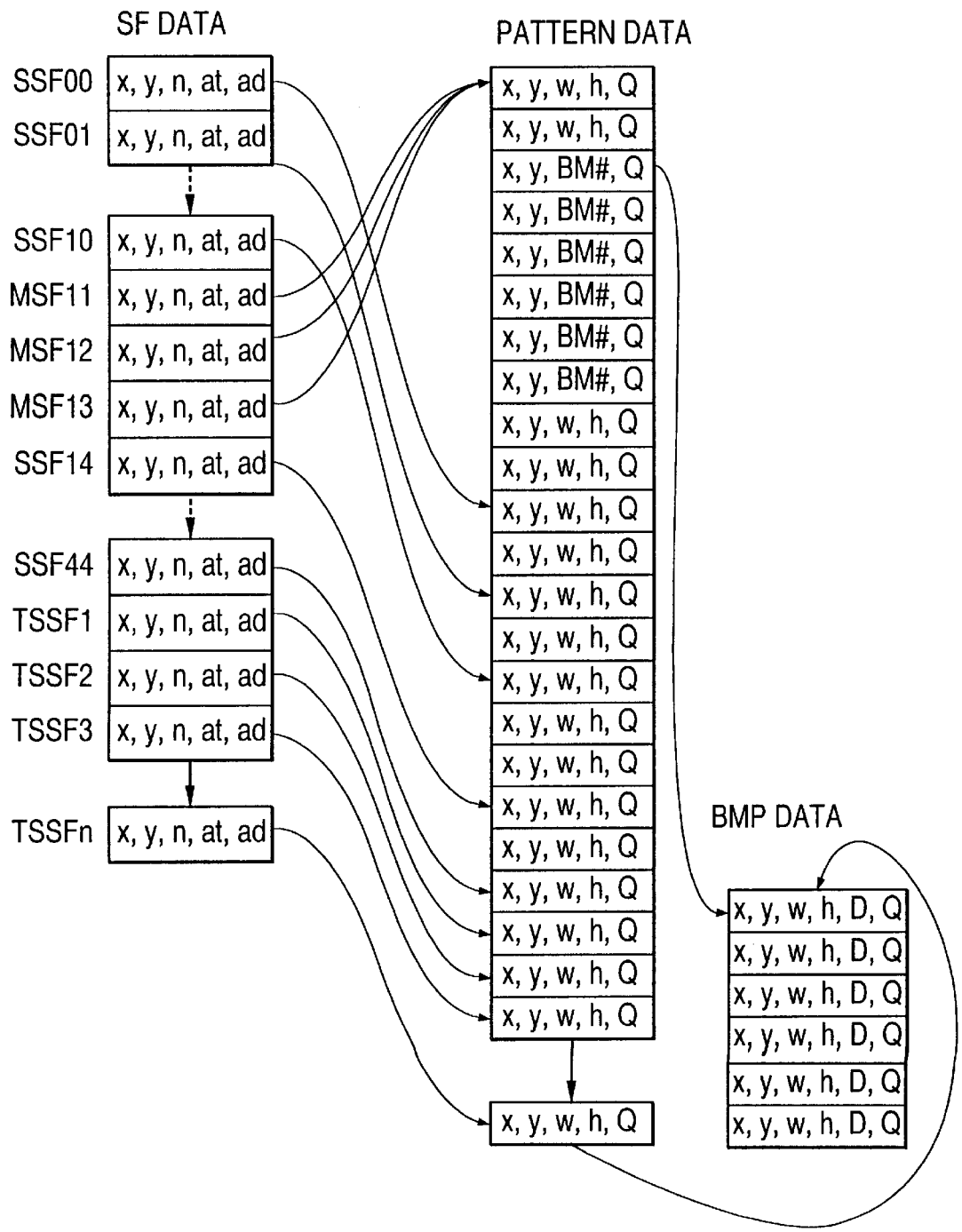
FIG. 32 is an example of the composition of exposure data in a case where a combination of block masks is used.

FIG. 32 is an example of the composition of exposure data in a case where a mixture of block masks are used. In this example, a matrix-positioned sub-field MSF11 etc. comprises a standard variable rectangular pattern and a block mask. Six block masks are used in the pattern data. The block mask pattern data comprises, for example, its position (x,y), the block mask number BM#, and a quantity of light Q.

However, block mask pattern BMP data is also appended for each block mask in order that algorithms for correcting the quantity of exposure or generating supplementary exposure patterns from the area pattern densities can be applied. This block mask pattern BMP data is used only for correcting the quantity of exposure, and the like, but it is not used for the actual exposure data. The block mask pattern BMP data comprises: the position (x,y), width w, height h, density D and quantity of exposure Q.

By generating the aforementioned block mask pattern data for each block mask and treating this pattern data similarly to normal pattern data, it is possible to determine the pattern density of each area in the manner described above.

FIG. 15 shows an example of area data. When areas are generated in a sub-field SF, area data is produced as shown in FIG. 15. The area data comprises, respectively for each of the areas a11–aij in the sub-field SF: the position of the area: the position of the bottom-left point and top-right point of the pattern existing region within the area; the pattern density; the pattern density after correction; a flag indicating whether or not a supplementary exposure pattern has been generated; and a flag indicating whether or not the area is inside a matrix-positioned sub-field MSF; and the like.

As described above, when a block mask is used in addition to a variable rectangular pattern, areas are generated inside a sub-field, the pattern density in each area is determined, the pattern density is corrected by taking account of the pattern density corresponding to exposure effects, on the basis of the pattern densities of surrounding areas and the distance between areas, and the quantity of exposure can be corrected and supplementary exposure patterns can be generated on the basis of this corrected pattern density.

As shown in the example in FIG. 28, the block mask BM contains a plurality of patterns. Therefore, at step S11 in the flow-chart in FIG. 5, where the quantity of exposure Q corresponding to the pattern shape is determined, the problem arises of how to supply the optimum quantity of exposure to the block mask. In particular, when using a method wherein the quantity of exposure Q is determined according to the line width of the patterns present in the block mask, if very narrow pattern data is present, the quantity of exposure may be set to an excessively high figure to correspond to this narrow pattern data. As a result, too much exposure energy will be supplied, and when patterns having a normal, thicker line width are developed, the line width will be thicker than necessary.

These problems are not limited to block masks, but also exist for normal variable rectangular patterns. For example, even in a pattern designed on a $\mu$m line width rules, pattern data narrower than this is still present in the pattern. In this case, if too much exposure energy is supplied in order to correspond with this narrower pattern data, the patterns of a $\mu$m line width will also be affected undesirably, due to proximity exposure effects, and the like.

Therefore, in the present embodiment, when using block masks, a plurality of block mask proposed minimum line widths are set in an order of priority. The pattern data in each block mask is checked, and if pattern data narrower than a set line width is present, the quantity of light corresponding to this proposed minimum line width is set as the quantity of exposure for that block mask. These proposed minimum line widths are used in order of their priority. In a variable rectangular pattern also, a minimum line width is set, and a quantity of exposure corresponding to the set minimum line width is set for any patterns which are narrower than this.

FIG. 33 shows an example of a table of minimum line width settings contained in the design data. FIG. 33(a) is a table of proposed minimum line widths corresponding to block mask pattern data. In this example, the minimum line width settings are, in order of priority, w1=0.18 $\mu$m, w2=0.20 $\mu$m, w3=0.22 $\mu$m, w4=0.24 $\mu$m, and w5=0.26 $\mu$m.

FIG. 33(b) is a table of minimum line widths wmin corresponding to standard variable rectangular pattern data. In this example, wmin is set to 0.18 $\mu$m.

FIG. 34 shows examples of block masks. In FIG. 34(a), the block mask BM contains a plurality of patterns, and the corresponding pattern data comprises line widths of 0.18 $\mu$m, 0.16 $\mu$m and 0.14 $\mu$m. Here, the 0.16 $\mu$m and 0.14 $\mu$m line widths lie in a diagonal line and are narrower than this in the pattern data. In FIG. 34(b), the block mask BM contains four rectangular patterns of widths 0.40 $\mu$m and 0.80 $\mu$m.

Figure 35:
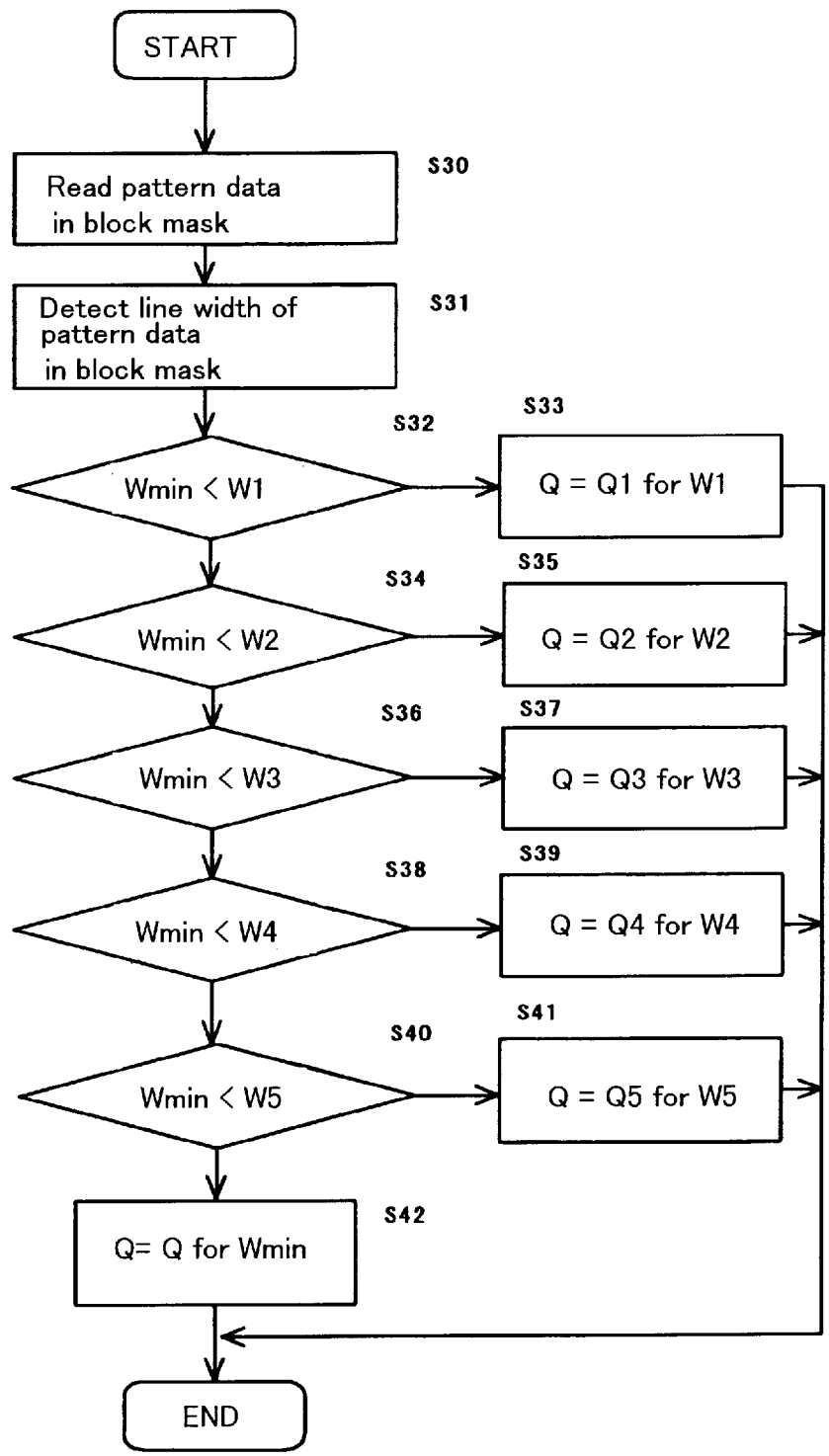
FIG. 35 is a flow-chart of a process for setting the quantity of exposure.

FIG. 35 is a flow-chart of a case where the quantity of exposure is set using a minimum line width from the minimum line width table. This corresponds to a detailed flow-chart of a portion of step S11 in the flow-chart shown in FIG. 5. Firstly, the pattern data in the block mask is read out (S30). The block mask pattern generating section 111 illustrated in FIG. 2 reads out pattern data corresponding to the block mask number. It then detects the line widths from the pattern data and detects the minimum line width Wmin (S31).

If the detected minimum line width Wmin is less than the proposed minimum line width w1 (S32), then a quantity of exposure Q1 corresponding to this proposed minimum line width w1 is set as the quantity of exposure Q for the block mask (S33). Furthermore, if the detected minimum line width Wmin lies between the proposed minimum line widths w1 and w2 (S34), then a quantity of exposure Q2 corresponding to the proposed minimum line width w2 is set as the quantity of exposure Q for the block mask (S35). The quantity of exposure is set similarly thereafter. If the detected minimum line width Wmin is greater than any of the proposed minimum line widths (S40), a quantity of exposure corresponding to the detected minimum line width Wmin is set (S42).

In the case of determining the quantity of exposure for the block mask in FIG. 34(a), since the detected minimum line width is Wmin=0.14 $\mu$m and this is narrower than the first priority minimum line width w1=0.18 $\mu$m, the quantity of exposure Q1 corresponding to w1 is set as the quantity of exposure Q for the block mask. Furthermore, when determining the quantity of light for the block mask in FIG. 34(b), since the detected minimum line width is 0.40 $\mu$m and this is greater than any of the proposed minimum line widths, a quantity of exposure corresponding to 0.40 $\mu$m is set.

In setting the quantity of exposure for a variable rectangular pattern, if the line width in the pattern data in question is narrower than the minimum line width Wmin=0.18 μm set according to FIG. 33(b), then a quantity of exposure corresponding to 0.18 μm is set, and if it is thicker than 0.18 μm, a quantity of exposure corresponding to the line width in the pattern data is set.

As described above, in the present embodiment, when proposed minimum line widths are previously set, then even if pattern data narrower than these line widths is present, the quantity of exposure set will not be greater than a quantity of exposure corresponding to the proposed minimum line widths. In this way, a quantity of exposure optimally suited to the design rules can be set. Furthermore, even if the pattern data is narrower than the pattern width when actually constructed, the quantity of exposure will not be set to an excessively high level, and therefore it is possible to prevent generation of thick developed patterns due to high quantities of exposure, which run counter to the design rules.

By providing proposed minimum line widths along with the design data, exposure energy quantities suited to the design rules can be set. Moreover, by subsequently generating areas and revising the quantity of exposure in accordance with the pattern densities of these areas, even more suitable exposure quantities can be determined.

Figure 36:
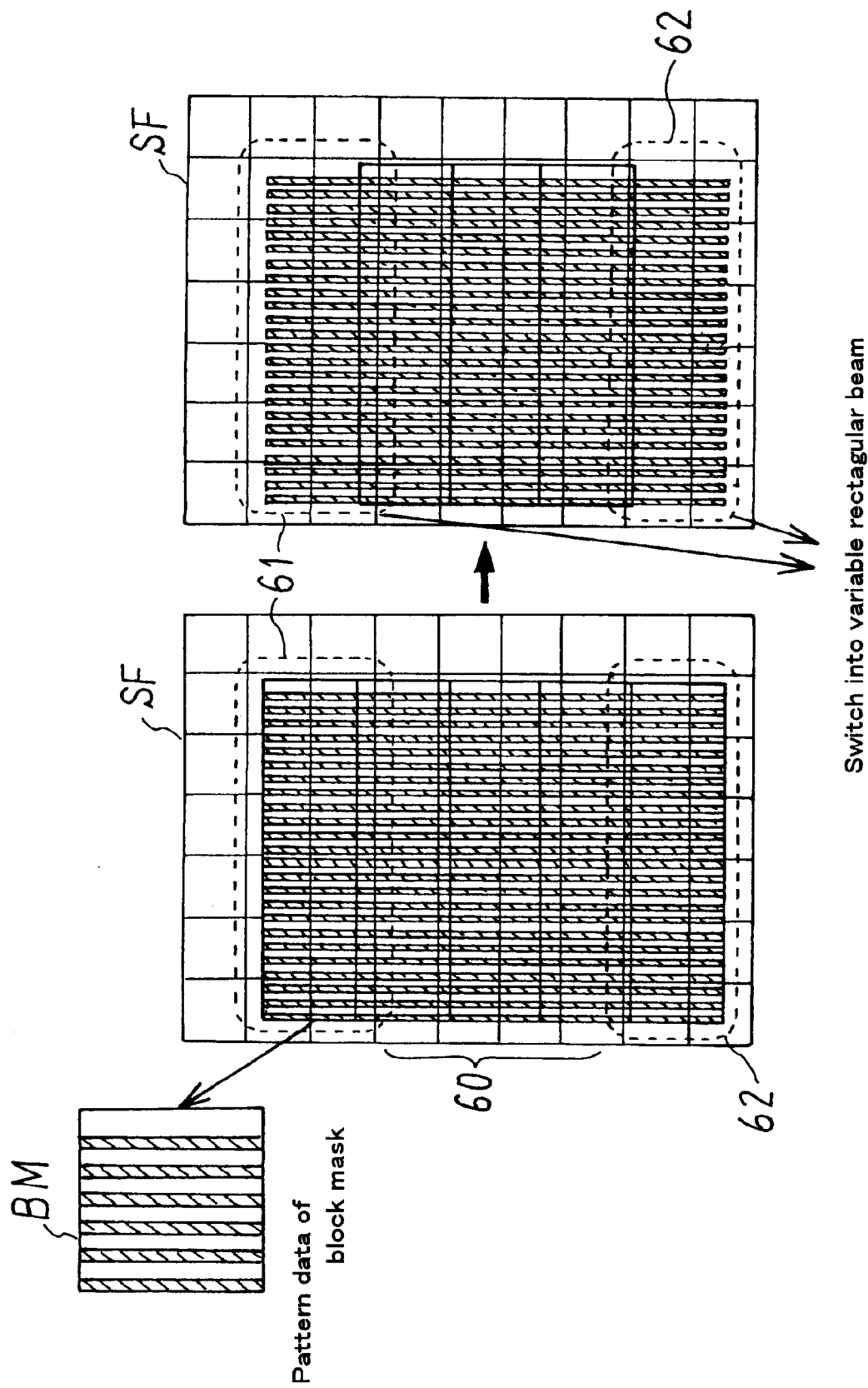
FIG. 36 is a diagram showing sub-fields containing line and space patterns formed using block masks.

FIG. 36 shows a sub-field containing a line and space pattern formed using block masks. In this example, the block masks contain six line patterns. It is known that, when a block exposure pattern is exposed using a block mask, the line width of the line patterns will thicken due to Coulomb interaction, which is a type of light interference. However, if a block exposure pattern is exposed in a matrix fashion using a block mask, as in FIG. 36, in the center 60 of the matrix, this effect of thickening of the line pattern width will not be produced, due to interference between the respective block exposure patterns. Hence, the block exposure patterns in regions 61 and 62 at either end of the line patterns will tend to have a thicker line width.

Coulomb interaction is a phenomenon specific to block masks, and it is thought to be caused by the fact that an electron beam is present across a wide region of the block mask simultaneously. Therefore, in the present embodiment, when exposing a line and space pattern using block masks, the block masks at the end regions 61 and 62 are changed to standard variable rectangular patterns. Consequently, it is possible to avoid the Coulomb interaction effect intrinsic to block exposure. Since the regions 61 and 62 are of high density, the quantity of light for each pattern in these regions is corrected to a lower value in accordance with the aforementioned area pattern densities. The line patterns are then exposed one by one. By this means, it is possible to avoid thickening of the line width due to Coulomb interaction.

FIG. 37 shows an example of a block mask having a large exposure surface area. In the case of a block mask BM having a large exposure surface area, as illustrated in FIG. 37(a), cross-lines are inserted into the exposure region, as illustrated in FIG. 37(b). In other words, a region having a large exposure surface area is set as a lattice-shaped exposure region as shown in FIG. 37(b), such that optimum light exposure is achieved whilst suppressing the effects of Coulomb interaction due to light interference. The block mask pattern of FIG. 37(b) contains transmission holes in a lattice configuration.

By inserting cross-lines in this way, the transmission hole surface area in the block exposure pattern data becomes considerably smaller than the transmission hole surface area before inserting cross-lines. As a result, when areas are generated in the block mask region and the pattern densities in these areas are found, it can be supposed that these will be less than the exposure reference ratio shown in FIG. 10. Consequently, in the aforementioned method for generating exposure data, it will be determined that the region is of low pattern density, and supplementary exposure patterns will be generated. Furthermore, since block exposure patterns using a block mask are generated by repetition in a matrix fashion, then if supplementary exposure patterns are generated, a very large amount of supplementary exposure pattern data will be appended.

However, in high-density block exposure patterns designed to prevent Coulomb interaction like FIG. 37(b), it is not necessary to generate supplementary exposure patterns. Therefore, in the present embodiment, it is assumed that the transmission hole surface area falls when cross-lines are generated in the block exposure pattern data, and for regions where this applies, the exposure reference ratio, which is the reference for generating supplementary exposure patterns, is reduced.

As described above, according to the present invention, in generating charged particle beam exposure data, when areas are generated within sub-fields, the pattern densities of these areas are determined, and supplementary exposure patterns are produced according to these pattern densities, it is possible to generate highly suitable supplementary exposure patterns for the exposure patterns, even if the exposure patterns and the areas do not coincide.

Furthermore, according to the present invention, even if the exposure patterns and the areas do not coincide, as described above, since supplementary exposure patterns can be appended by checking the distance between exposure patterns, it is possible to prevent the effect of narrowing in the developed patterns due to insufficient proximity exposure effects.

Furthermore, according to the present invention, even if supplementary exposure patterns are generated uniformly to the size of the areas, since supplementary exposure patterns can be generated which have a step-shaped quantity of exposure distribution depending on the resist material, it is possible to generate the optimum proximity exposure effect for the resist material.

According to the present invention, by generating areas from the center of a region comprising a group of exposure patterns to the periphery thereof, it is possible to resolve problems arising from mismatching between exposure patterns and areas.

According to the present invention, when the area pattern densities are determined and then these pattern densities are corrected to account for exposure effects from patterns in surrounding areas, since the scale of these effects can be determined according to the distance to the pattern existing regions in the surrounding areas, it is possible to generate supplementary exposure patterns with a higher degree of accuracy.

Moreover, according to the present invention, for matrix-positioned sub-fields, the calculations described above only need to be carried out for the first matrix-positioned sub-field which forms a reference, and the calculations for the remaining matrix-positioned sub-fields can be omitted, thereby shortening the calculation time required for determining exposure data from design data.

As described above, according to the present invention, even if a combination of block exposure patterns and variable rectangular patterns is used, pattern densities are determined by generating areas, and the respective quantities of exposure can be corrected, or supplementary exposure patterns can be generated, in accordance with these pattern densities, in addition to which the quantities of exposure for the block exposure patterns can be set to suitable values with regard to the design rules.

According to the present invention, even if the block exposure pattern data contains narrower patterns than the minimum line width according to the design rules, by setting proposed minimum line widths, it is possible to prevent the quantity of exposure from being set excessively high. Furthermore, in the case of variable rectangular patterns also, by setting a minimum line width according to the design rules, it is possible to prevent the quantity of exposure from becoming excessively high.

According to the present invention, by changing block exposure patterns in edge regions to variable rectangular patterns and exposing them as variable rectangular patterns, it is possible to prevent any decline in line accuracy in line and space patterns due to Coulomb interaction when a block mask is used.

According to the present invention, it is possible to prevent excessive generation of supplementary exposure patterns, when Coulomb interaction is prevented, by inserting cross-lines into a block exposure pattern.

What is claimed is:

1. A charged particle beam exposure method, wherein exposure data comprising exposure pattern data for each of a plurality of sub-fields located in a main field is determined from pattern data comprising pattern data for each of said sub-fields, and a material is exposed in accordance with said exposure data, comprising the steps of:
    (a) generating a plurality of areas within said sub-fields;
    (b) determining the pattern density within each of said areas, and correcting said pattern density in accordance with the pattern density of areas surrounding said area and the distance between areas;
    (c) generating a supplementary exposure pattern in said area when said corrected pattern density for said area is lower than a prescribed reference exposure density;
    (d) further generating a supplementary exposure pattern in areas lying between pattern existing regions where said patterns are located, and having a pattern density higher than said reference exposure density, when the distance between said pattern existing regions is greater than a prescribed reference distance; and
    (e) exposing said material in accordance with said exposure data comprising said supplementary exposure pattern data appended to said pattern data.

2. The charged particle beam exposure method according to claim 1, wherein pattern existing regions in said areas are generated in step (b); and the distances between said pattern existing regions are determined in accordance with said pattern existing region data generated for each area, in step (d).

3. A charged particle beam exposure method, wherein exposure data comprising exposure pattern data for each of a plurality of sub-fields located in a main field is determined from pattern data comprising pattern data for each of said sub-fields, and a material is exposed in accordance with said exposure data, comprising the steps of:
    (a) generating a plurality of areas within said sub-fields;
    (b) determining the pattern density within each of said areas, and correcting said pattern density in accordance with the pattern density of areas surrounding said area and the distance between areas;
    (c) generating a supplementary exposure pattern in said area according to the corrected pattern when said corrected pattern density for said area is lower than a prescribed reference exposure density, wherein said supplementary exposure pattern has a desired quantity of exposure distribution according to the resist material on said material; and
    (d) exposing said material in accordance with exposure data comprising said supplementary exposure pattern data appended to said pattern data.

4. The charged particle beam exposure method according to claim 3, wherein the quantity of exposure distribution of said supplementary exposure pattern can be set to an optimum value with regard to the degree of spreading of the exposure energy in said resist material.

5. A charged particle beam exposure method, wherein exposure data comprising exposure pattern data for each of a plurality of sub-fields located in a main field is determined from pattern data comprising pattern data for each of said sub-fields, and a material is exposed in accordance with said exposure data, comprising the steps of:
    (a) generating a plurality of areas in point symmetry from the center of pattern existing regions in said sub-field, within a peripheral region of a prescribed range;
    (b) determining the pattern density within each of said areas, and correcting said pattern density in accordance with the pattern density of areas surrounding said area, and the distance between said areas;
    (c) generating a supplementary exposure pattern in said area according to the corrected pattern when said corrected pattern density for said area is lower than a prescribed reference exposure density; and
    (d) exposing said material in accordance with exposure data comprising said supplementary exposure pattern data appended to said pattern data.

6. A charged particle beam exposure method, wherein exposure data comprising exposure pattern data for each of a plurality of sub-fields located in a main field is determined from pattern data comprising pattern data for each of said sub-fields, and a material is exposed in accordance with said exposure data, comprising the steps of:
    (a) generating a plurality of areas within said sub-fields;
    (b) determining the pattern density within each of said areas, and correcting said pattern density in accordance with the pattern density of areas surrounding said area and the distance between pattern existing regions in said areas;
    (c) generating a supplementary exposure pattern in said area when said corrected pattern density for said area according to the corrected pattern is lower than a prescribed reference exposure density; and
    (d) exposing said material in accordance with exposure data comprising said supplementary exposure pattern data appended to said pattern data.

7. The charged particle beam exposure method according to claim 6, wherein the distance between pattern existing regions in said areas is taken as the distance between the centers of gravity of said pattern existing regions.

8. A charged particle beam exposure method, wherein exposure data comprising exposure pattern data for each of a plurality of sub-fields located in a main field is determined from pattern data comprising pattern data for each of said sub-fields, and a material is exposed in accordance with said exposure data, comprising the steps of:
    (a) generating a plurality of areas within said sub-fields;
    (b) determining the pattern density within each of said areas, and correcting said pattern density in accordance with the pattern density of areas surrounding said area and the distance between areas;

(c) generating a supplementary exposure pattern in said area when said corrected pattern density for said area is lower than a prescribed reference exposure density; and (d) exposing said material in accordance with exposure data comprising said supplementary exposure pattern data appended to said pattern data;

wherein, when a plurality of sub-fields comprising the same pattern data are positioned by repetition, said steps (a)–(c) are implemented for the first of said repeated sub-fields, and if no supplementary exposure pattern is generated in said first sub-field, said steps (a)–(c) are omitted for the remaining sub-fields, with the exception of at least a portion thereof.

9. The charged particle beam exposure method according to claim 8, wherein said steps (a)–(c) are implemented for the boundary regions of said sub-fields positioned by repetition.

10. A charged particle beam exposure method, wherein a charged particle beam passing through a block mask containing a plurality of patterns is irradiated onto a material to be exposed, comprising the steps of:

specifying a proposed minimum line width for pattern data in said block mask;

setting a quantity of exposure corresponding to said proposed minimum line width as the quantity of exposure for said block mask, when the minimum line width of the pattern data in said block mask is narrower than said proposed minimum line width, and setting a quantity of exposure corresponding to the minimum line width of said pattern data as the quantity of exposure for said block mask, when the minimum line width of the pattern data in said block mask is thicker than said proposed minimum line width; and irradiating a charged particle beam having said set quantity of exposure onto said material to be exposed by passing it through said block mask.

11. The charged particle beam exposure method according to claim 10, wherein a plurality of said proposed minimum line widths are set in a prescribed order of priority in the step of specifying said proposed minimum line width; and a quantity of exposure corresponding to the proposed minimum line width which is close, of said set plurality of proposed minimum line widths, to the minimum line width of the pattern data in said block mask, is set as the quantity of exposure for said block mask.

12. The charged particle beam exposure method according to claim 10, comprising the steps of: generating a plurality of areas within said sub-fields; determining the pattern density within each of said areas, and correcting said pattern density in accordance with the pattern density of areas surrounding said area, and the distance between areas; and correcting the quantity of exposure set for block exposure pattern belonging to that area to a lower quantity, when said corrected pattern density for said area is higher than a prescribed exposure reference density.

13. A charged particle beam exposure method wherein a charged particle beam is shaped in accordance with variable rectangular pattern data and is irradiated onto a material to be exposed, comprising the steps of:

specifying a proposed minimum line width corresponding to said variable rectangular pattern data;

setting a quantity of exposure corresponding to said proposed minimum line width as the quantity of exposure for said variable rectangular pattern, when the minimum line width of said variable rectangular pattern data is narrower than said proposed minimum line width, and setting a quantity of exposure corresponding to the minimum line width of said variable rectangular pattern as the quantity of exposure for said variable rectangular pattern, when the minimum line width of said variable rectangular pattern data is thicker than said proposed minimum line width; and shaping a charged particle beam having said set quantity of exposure light into said variable rectangular beam and irradiating said beam onto said material to be exposed.

14. A charged particle beam exposure method wherein a charged particle beam passing through a block mask containing a plurality of patterns is irradiated repeatedly in a matrix fashion onto a material to be exposed, comprising the steps of:

exposing block exposure patterns corresponding to regions located at the perimeter of said matrix in said matrix-shaped exposure region, by a variable rectangular beam; and exposing block exposure patterns corresponding to regions located at the center of said matrix in said matrix-shaped exposure region, by a charged particle beam passing through said block mask.

15. A charged particle beam exposure method, wherein exposure data comprising exposure pattern data for each of a plurality of sub-fields existing in a main field is determined from pattern data comprising pattern data for each of said sub-fields, and a material is exposed in accordance with said exposure data, comprising the steps of:

generating a plurality of areas within said sub-fields;

determining the pattern density within each of said areas, and correcting said pattern density in accordance with the pattern density of areas surrounding said area, and the distance between areas;

generating a supplementary exposure pattern in said area according to the corrected pattern when said corrected pattern density for said area is lower than a prescribed reference exposure density; and exposing said material in accordance with exposure data comprising said supplementary exposure pattern data appended to said pattern data;

wherein said reference exposure density is lower for areas having a block mask pattern containing transmission holes in a lattice configuration, than for other areas.

16. A charged particle beam exposure method comprising:

generating areas within sub-fields of a main field;

determining pattern density within each of the areas, and correcting the pattern density in one of the areas in accordance with the pattern density of each of the areas surrounding the one of the areas and the respective distances between the one of the areas and the each of the surrounding areas; and generating a supplementary exposure pattern in the one of the areas according to the corrected pattern.

* * * * *

UNITED STATES PATENT AND TRADEMARK OFFICE
CERTIFICATE OF CORRECTION

PATENT NO. : 6,087,052
DATED : July 11, 2000
INVENTOR(S) : Yasuo Manabe, et al.

Page 1 of 1

It is certified that error appears in the above-identified patent and that said Letters Patent is hereby corrected as shown below:

Column 26,
Line 47, after "area" insert -- according to the corrected pattern -- .
Line 48, delete "according to the corrected pattern --.

Column 27,
Line 2, after "area" insert -- according to the corrected pattern --.

Signed and Sealed this

Fourteenth Day of August, 2001

*Attest:*

Nicholas P. Godici

NICHOLAS P. GODICI
*Attesting Officer* *Acting Director of the United States Patent and Trademark Office*